(12) United States Patent
Fujimoto et al.

(10) Patent No.: US 7,928,353 B2
(45) Date of Patent: Apr. 19, 2011

(54) DISPLAYING DEVICE AND LIGHTING DEVICE EMPLOYING ORGANIC ELECTROLUMINESCENCE ELEMENT

(75) Inventors: Akira Fujimoto, Kawasaki (JP); Koji Asakawa, Kawasaki (JP); Tsutomu Nakanishi, Tokyo (JP); Eishi Tsutsumi, Kawasaki (JP); Ryota Kitagawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 31 days.

(21) Appl. No.: 12/392,691

(22) Filed: Feb. 25, 2009

(65) Prior Publication Data
US 2009/0236962 A1  Sep. 24, 2009

(30) Foreign Application Priority Data
Mar. 21, 2008  (JP) .................................. 2008-73144

(51) Int. Cl.
*H01J 1/46*  (2006.01)
(52) U.S. Cl. ..................................... 250/208.1; 313/506
(58) Field of Classification Search ............... 250/208.1; 313/506
See application file for complete search history.

(56) References Cited

U.S. PATENT DOCUMENTS

| 6,565,763 | B1 | 5/2003 | Asakawa et al. |
| 6,894,432 | B2 * | 5/2005 | Fujieda et al. ............... 313/506 |
| 2009/0211783 | A1 * | 8/2009 | Tsutsumi et al. .......... 174/126.1 |

FOREIGN PATENT DOCUMENTS

| JP | 11-072607 | 3/1999 |
| JP | 2000-101114 | 4/2000 |
| JP | 2005-279807 | 10/2005 |
| JP | 2005-332705 | 12/2005 |
| JP | 2007-234591 | 9/2007 |
| JP | 2008-047355 | 2/2008 |

OTHER PUBLICATIONS

Harrison et al.; "Dynamics of Pattern Coarsening in a Two-Dimensional Smectic System", Physical Review E, vol. 66, The American Physical Society, pp. 011706-1-011706-27, (2002).

* cited by examiner

*Primary Examiner* — Seung C Sohn
(74) *Attorney, Agent, or Firm* — Finnegan, Henderson, Farabow, Garrett & Dunner, L.L.P.

(57) ABSTRACT

The Present invention provides an organic EL display and a lighting device having high efficiency. The organic EL display comprises a substrate, a pixel-driving circuit unit, and pixels arranged in the form of a matrix on the substrate. The pixel comprises a light-emitting part, and the light-emitting part is composed of a first electrode placed near to the substrate, a second electrode placed far from the substrate, and at least one organic layer placed between the first and second electrodes. The second electrode has a metal electrode layer having a thickness of 10 nm to 200 nm, and the metal electrode layer comprises a metal part and plural openings penetrating through the layer. The metal part is seamless and formed of metal continuously connected without breaks between any points therein. The openings have an average opening diameter of 10 nm to 780 nm, and are arranged so periodically that the distribution of the arrangement is represented by a radial distribution function curve having a half-width of 5 nm to 300 nm.

18 Claims, 6 Drawing Sheets

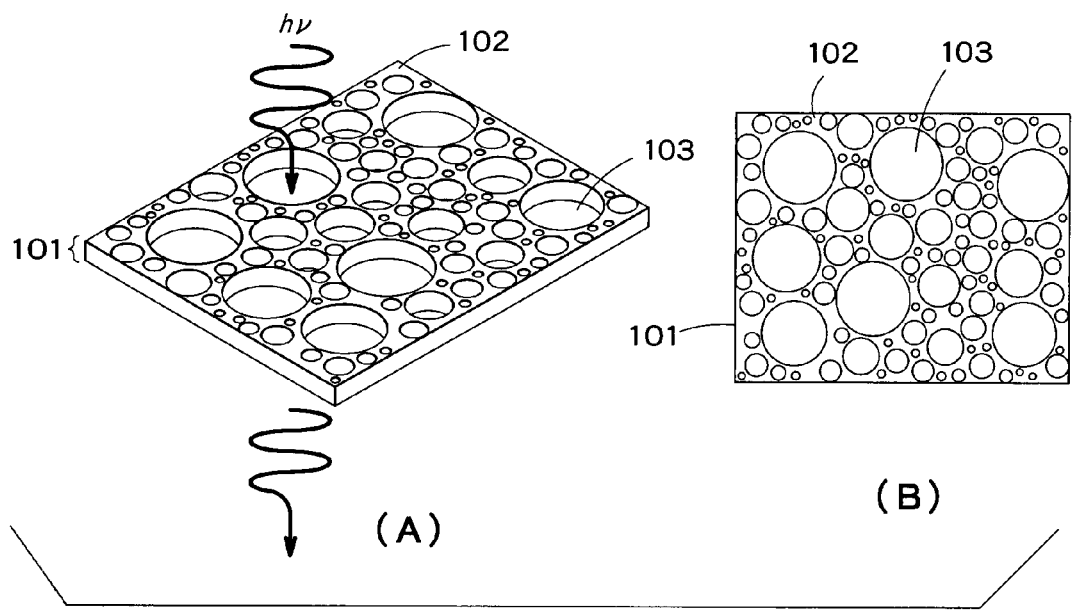
F I G. 1
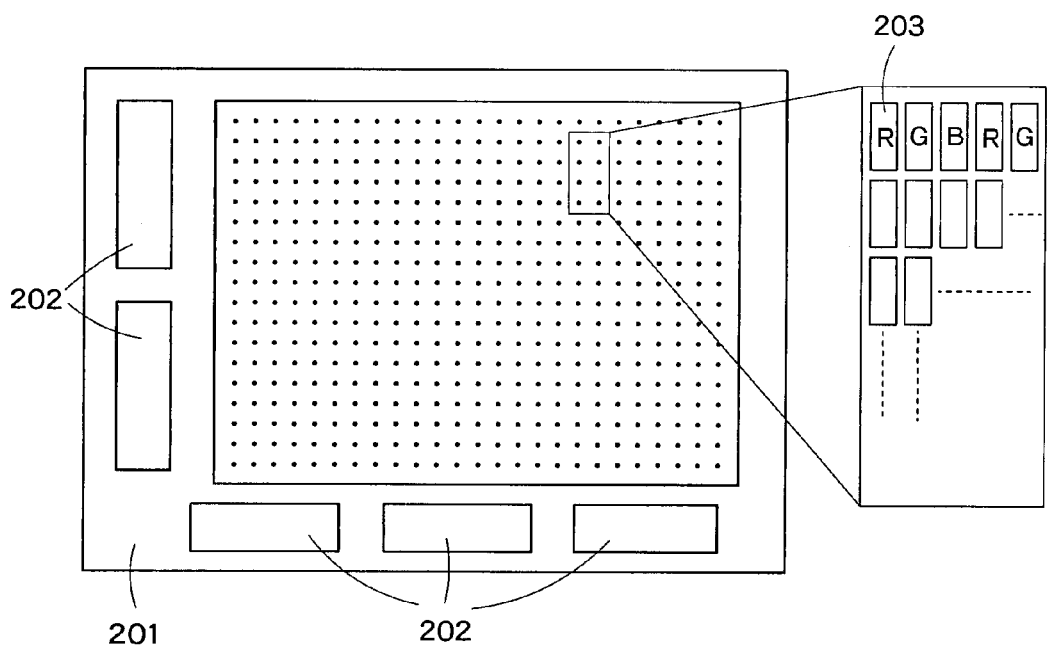
F I G. 2

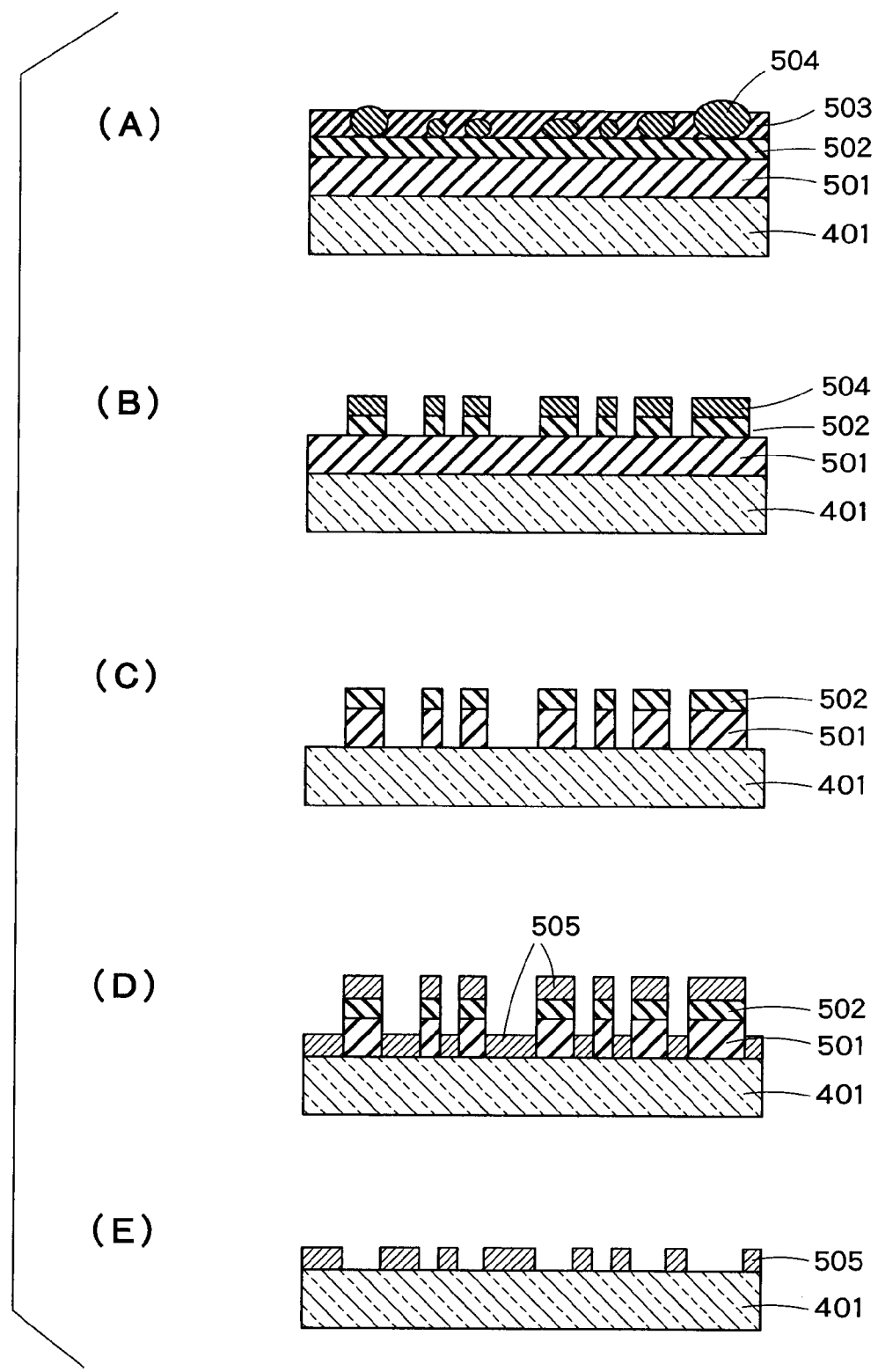
F I G. 5

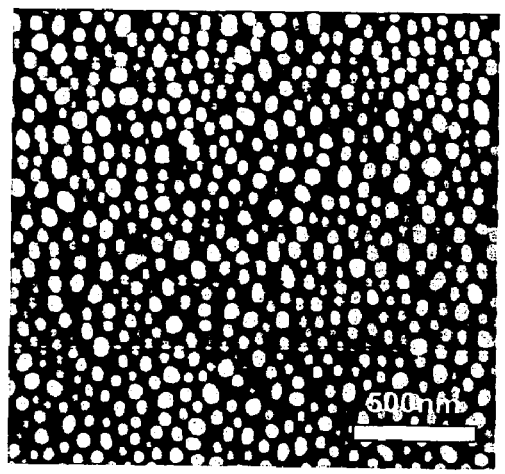
F I G. 6
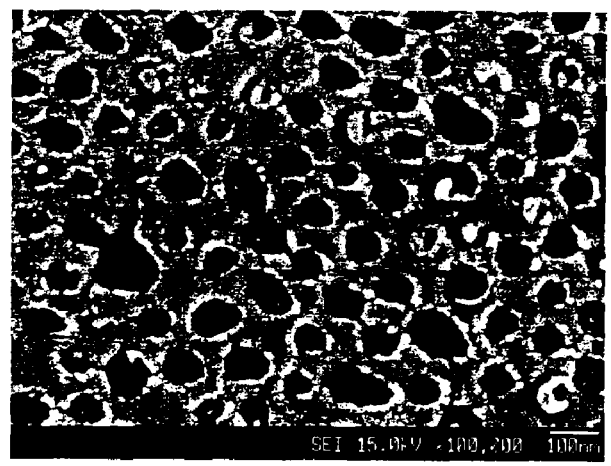
F I G. 7

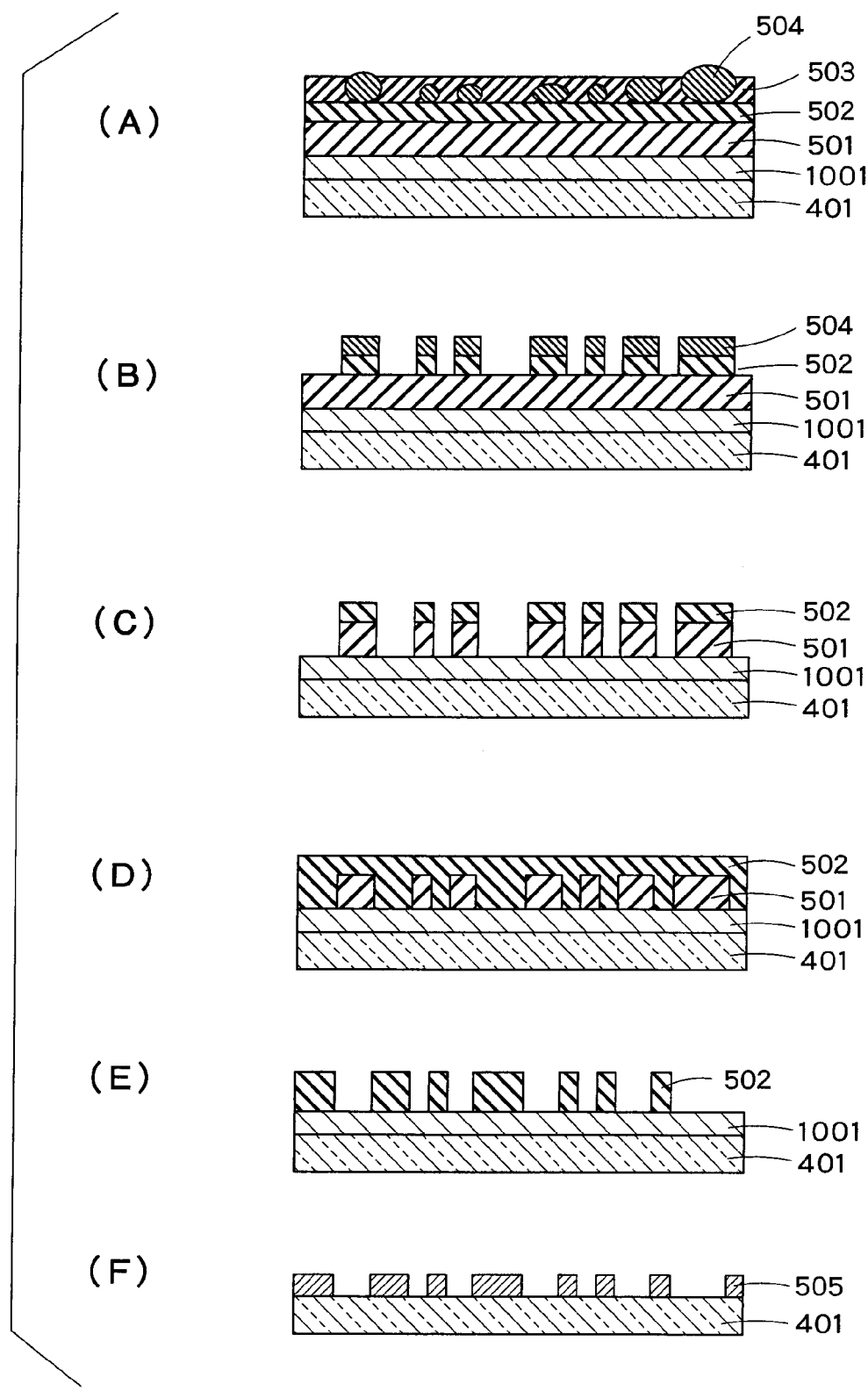
F I G. 10

DISPLAYING DEVICE AND LIGHTING DEVICE EMPLOYING ORGANIC ELECTROLUMINESCENCE ELEMENT

CROSS-REFERENCE TO RELATED APPLICATIONS

This application is based upon and claims the benefit of priority from the prior Japanese Patent Applications No. 73144/2008, filed on Mar. 21, 2008; the entire contents of which are incorporated herein by reference.

BACKGROUND OF THE INVENTION

1. Field of the Invention

The present invention relates to a displaying device and a lighting device employing an organic electroluminescence element (hereinafter, referred to as "organic EL element") of high efficiency.

2. Background Art

An organic EL element is a light-emitting device in which electrons and positive holes are injected into an organic layer to emit light. Because of self-luminosity, it is characteristic of the organic EL element to give high contrast views and to have a very thin light-emitting part. Accordingly, it is being studied to use the organic EL elements in practical application to thin flat displaying devices and thin flat lighting devices. These devices are employable for cellular phones, thin TV sets and household lighting equipments.

In the organic EL element, a transparent electrode is provided as an electrode on the anode side. The transparent electrode is normally a layer made of indium tin oxide (hereinafter, referred to as "ITO"), which is indium oxide doped with tin as a dopant. This electrode must have not only enough electrical conductivity to function as an electrode but also transparency to light emitted from the light-emitting layer.

A displaying device employing the organic EL element (hereinafter, referred to as "organic EL display") preferably has a top emission type element structure, in which a TFT (thin film transistor) array is provided on the substrate side opposite to the light-emitting side so as to enlarge the imaging area. In the top emission type element structure, an upper electrode placed on the light-emitting side needs to transmit light. For that reason, in a normal displaying device, the light-transmitting electrode is generally made of ITO. However, in producing the organic EL display of top emission type, the upper electrode on the light-emitting side must be formed after the organic light-emitting layer is formed. Accordingly, it is difficult to adopt an ITO electrode in the top emission type organic EL display because a sputtering process or a high-temperature treatment is necessary to form the ITO electrode.

Meanwhile, a lighting device employing the organic EL element (hereinafter, referred to as "organic EL lighting device") is required to be thinner and to have a larger light-emitting area. However, if a commonly used ITO layer is used as the light-transmitting electrode, it is difficult for the EL lighting device to emit light evenly from the whole surface. The reason of that is because the ITO layer has 100 times or more as large resistivity as a normal metal electrode and hence the resistance in plane increases according as the light-emitting area increases.

Further, indium, which is a material of the ITO layer, is such a rare metal that exhaustion thereof in the future is now brought into a serious problem. Accordingly, there is a fear that it will be difficult to procure indium in the future.

To solve the above problems about the ITO layer, it is being studied to employ a thin metal layer as the light-transmitting electrode.

Generally in producing an organic EL display, a very thin semi-transparent metal electrode having a thickness of a few nanometers to dozens of nanometers is formed by vacuum deposition or the like, which less damages the organic light-emitting layer. However, the semi-transparent metal electrode considerably lowers light-transparency to impair brightness of the resultant EL display seriously. Accordingly, in order to obtain emission in high brightness, it is necessary to increase the device-driving voltage. However, if the voltage is increased, heat is unfavorably generated to significantly shorten the working life-time of the display. Further, it is difficult to evenly produce the very thin semi-transparent metal electrode if the display has a large displaying surface. This means that a process margin in the procedures of forming the upper electrode becomes so small that the yield in mass-production is lowered.

Also in producing an organic EL lighting device, it is difficult to evenly produce the very thin semi-transparent metal electrode if the device has a large light-emitting surface. In addition, if the electrode has a thickness enough to ensure high electrical conductivity, the light-transparency is impaired.

As described above, it has been difficult for the conventional light-transmitting electrode such as an ITO layer or a thin metal layer to be on a high level of both light-transparency and electrical conductivity.

For the purpose of solving the above dilemma, there is an attempt to reduce resistance of the ITO layer. For example, JP-A 2005-332705(KOKAI) discloses a technology for forming an ITO layer having small resistance. In the disclosed technology, a transparent substrate is first coated with a metal mesh electrode having a thickness of not more than 15 µm, a line width of not more than 25 µm and an opening diameter of 50 µm to 2.5 mm. The openings of the mesh are then filled with a transparent resin film, and then an ITO layer is provided on the whole top surface. However, even in this technology, the metal mesh electrode serves as only an assistant to the ITO layer and hence does not essentially solve the above problems.

SUMMARY OF THE INVENTION

An organic EL display according to one embodiment of the present invention comprising:
a substrate,
a pixel-driving circuit unit, and
pixels arranged in the form of a matrix on said substrate;
wherein
  said pixel comprises a light-emitting part including
  a first electrode placed near to said substrate,
  a second electrode placed far from said substrate, said second electrode including a metal electrode layer having a thickness of 10 nm to 200 nm, and
  at least one organic layer placed between said first and second electrodes;
  and
  said metal electrode layer comprises
  a metal part is seamless and formed of metal continuously connected without breaks between any points therein, and
  plural openings which penetrate through said layer, which have an average opening diameter of 10 nm to 780 nm and which are arranged so periodically that the distribution of the arrangement is represented by a radial distribution function curve having a half-width of 5 nm to 300 nm.

Also, an organic EL display according to another embodiment of the present invention comprising:
a substrate,
a pixel-driving circuit unit, and
pixels arranged in the form of a matrix on said substrate;
wherein
said pixel comprises a light-emitting part including
a first electrode placed near to said substrate,
a second electrode placed far from said substrate, said second electrode including a metal electrode layer having a thickness of 10 nm to 200 nm, and
at least one organic layer placed between said first and second electrodes;
and
said metal electrode layer comprises
a metal part is seamless and formed of metal continuously connected without breaks between any points therein, and
plural openings which penetrate through said layer, which have an average opening diameter of 10 nm to ⅓ of the wavelength of used light in the visible wavelength region of 380 nm to 780 nm and which are arranged at such intervals that pitches among the centers of said openings are not less than the average diameter but not more than ½ of said wavelength of light,
under the condition that said metal part in 90% or more of the whole area of said metal electrode layer continues linearly without breaks by said openings in a straight distance of not more than ⅓ of said wavelength of light.

Further, a process according to still another embodiment of the present invention for production of the above organic EL display comprising:
for producing said second electrode in said pixel,
forming a phase-separated block copolymer layer in the form of a dot pattern of microdomains, and
producing a metal electrode layer having openings by an etching process in which said dot pattern of microdomains is used as a mask.

Furthermore, a process according to yet another embodiment of the present invention for production of the above organic EL display is characterized by comprising:
for producing said second electrode in said pixel,
forming an organic polymer layer on a substrate on which the electrode is to be formed,
forming a monolayer of fine particles in the form of a dot pattern of microdomains on said organic polymer layer,
processing said fine particles by etching until the particles have a desired size,
transferring said monolayer of the etching-processed fine particles onto the organic polymer layer, so that columnar structures made of the organic polymer and the etching-processed fine particles are formed on the surface of the transparent substrate,
forming a metal layer among the formed columnar structures, and
removing the organic polymer.

In addition, an organic EL lighting device according to still yet another embodiment of the present invention comprising
a transparent substrate,
a first electrode placed near to said transparent substrate,
a second electrode placed far from said transparent substrate, said second electrode including a metal electrode layer having a thickness of 10 nm to 200 nm, and
a light-emitting part placed between said first and second electrodes;
wherein
said metal electrode layer comprises
a metal part is seamless and formed of metal continuously connected without breaks between any points therein, and
plural openings which penetrate through said layer, which have an average opening diameter of 10 nm to 780 nm and which are arranged so periodically that the distribution of the arrangement is represented by a radial distribution function curve having a half-width of 5 nm to 300 nm.

Still further, an organic EL lighting device according to yet another embodiment of the present invention comprising
a transparent substrate,
a first electrode placed near to said transparent substrate,
a second electrode placed far from said transparent substrate, said second electrode including a metal electrode layer having a thickness of 10 nm to 200 nm, and
a light-emitting part placed between said first and second electrodes;
wherein
said metal electrode layer comprises
a metal part is seamless and formed of metal continuously connected without breaks between any points therein, and
plural openings which penetrate through said layer, which have an average opening diameter of 10 nm to ⅓ of the wavelength of used light in the visible wavelength region of 380 nm to 780 nm and which are arranged at such intervals that pitches among the centers of said openings are not less than the average diameter but not more than ½ of said wavelength of light,
under the condition that said metal part in 90% or more of the whole area of said metal electrode layer continues linearly without breaks by said openings in a straight distance of not more than ⅓ of said wavelength of light.

Still furthermore, a process according to yet another embodiment of the present invention for production of the above organic EL lighting device comprising:
for producing the electrodes,
forming a phase-separated block copolymer layer in the form of a dot pattern of microdomains,
producing a metal electrode layer having openings on the transparent substrate by an etching process in which said dot pattern of microdomains is used as a mask,
forming an organic electroluminescence layer on said metal electrode layer by vapor deposition or by coating, and
forming another electrode on said organic electroluminescence layer by vapor deposition.

Besides the above, a process according to still yet another embodiment of the present invention for production of the above organic EL lighting device is characterized by comprising:
for producing the metal electrode layer on the transparent substrate,
forming an organic polymer layer on a substrate on which the electrode is to be formed,
forming a monolayer of fine particles in the form of a dot pattern of microdomains on said organic polymer layer,
processing said fine particles by etching until the particles have a desired size,
transferring said monolayer of the etching-processed fine particles onto the organic polymer layer, so that columnar structures made of the organic polymer and the etching-processed fine particles are formed on the surface of the transparent substrate, forming a metal layer among the formed columnar structures, and removing the organic polymer.

According to embodiments of the present invention, organic EL displays and lighting devices of high efficiency are obtained. These devices have such excellent characteristics as to emit light with high but not uneven brightness and to have long working lifetimes. The EL displays or lighting devices of the present invention can be advantageously used as image-displaying units installed in, for example, thin TV sets and cellular phones or as lighting equipments such as room lights, respectively.

BRIEF DESCRIPTION OF THE DRAWINGS

FIG. 1 schematically illustrates an example of a pattern of the light-transmitting metal electrode having openings.

FIG. 2 is a schematic view of an organic EL display according to the present invention.

FIG. 5 conceptually illustrates a process for production of a light-transmitting metal electrode in the present invention.

FIG. 6 is an AFM image of the TPD mask formed on the SiO layer in Example 1.

FIG. 7 is a SEM image showing the surface structure of the second electrode formed in Example 2.

FIG. 10 conceptually illustrates a process for production of the organic EL lighting device produced in Example 10.

DETAILED DESCRIPTION OF THE INVENTION

Figure 3:
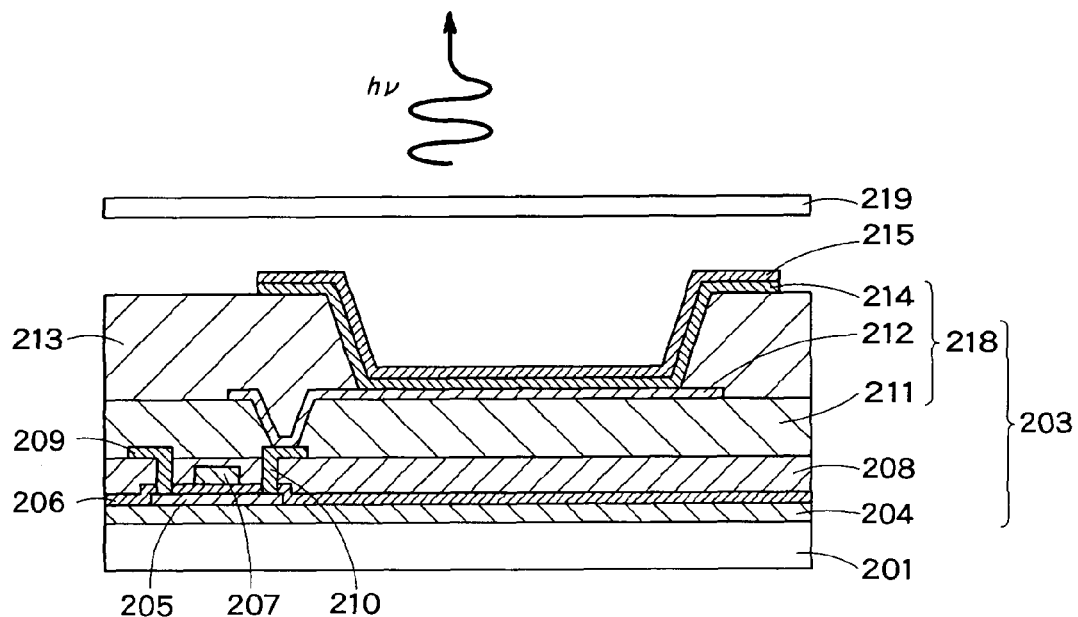
FIG. 3 schematically illustrates a sectional view of a pixel in an organic EL display according to the present invention.

Embodiments of the present invention are explained below in detail with the attached drawings referred to.

Light-Transmitting Metal Electrode

First, a light-transmitting metal electrode used in the present invention is described below.

With respect to the response of substance irradiated with light, the basic theory is explained in the following description.

Drude theory, which describes polarization of free electrons from the viewpoint of classical mechanics, tells us as follows. On the assumption that the mean scattering time of free electrons is much shorter than the period of oscillation of light, the dielectric function $\in(\omega)$ is expressed by the following formula (1):

$$\in(\omega) = \in_b(\omega) - \omega_p^2/\omega^2 \quad (1)$$

wherein $\omega_p^2 = ne^2/m^* \times \in_0$ is a plasma frequency of conduction electrons, and here n is a carrier density, e is an electric charge, $m^*$ is an effective mass, and $\in_0$ is the permittivity of vacuum. The first term of the formula (1) stands for contribution of the metal dipoles, and is about. 1, here. The second term stands for contribution of the conduction electrons.

As shown above, the plasma frequency is a function of the carrier density n. In the case of $\omega_0 > \omega$, the dielectric function $\in(\omega)$ gives a negative value and hence the incident light undergoes plasma reflection. On the other hand, in the case of $\omega > \omega_0$, the dielectric function $\in(\omega)$ gives a positive value and hence the light penetrates through the substance. Accordingly, the plasma frequency can be regarded as the threshold between reflection and penetration when the substance responds to light.

A typical metal has a plasma frequency in the ultraviolet region, and hence reflects visible light. For example, silver Ag has a carrier density of $n=6.9 \times 10^{22}$ $(cm^{-3})$, and the wavelength corresponding to the plasma frequency is positioned at about 130 nm in the ultraviolet region.

In contrast, the wavelength corresponding to the plasma frequency of oxide semiconductor ITO is positioned in the infrared wavelength region. The carrier density is in direct proportion to the electric conductivity and is in inverse proportion to the resistivity. This means that, if the dopant is increased to lower the resistivity, the plasma frequency is increased. Accordingly, when the dopant is increased to reach a particular amount, visible light in a longer wavelength region undergoes the plasma reflection to lower the transmittance.

As described above, in order that the oxide semiconductor material can ensure transparency in the visible region, the wavelength corresponding to the plasma frequency must be positioned in the infrared region. The carrier density, therefore, has an upper limit. For this reason, generally produced ITO has a carrier density of about. $n=1 \times 10^{21}$ $(cm^{-3})$, which is several percents of those of metals. The lower limit of resistivity derived from the above value is about 100 $\mu\Omega \cdot cm$, and it is essentially impossible to reduce the resistivity more. Thus, a light-transmitting electrode of oxide semiconductor such as ITO essentially has a lower limit of resistivity.

FIG. 1 shows one embodiment of the light-transmitting electrode used the present invention. FIG. 1(A) is a sketch of the metal electrode layer 101, and FIG. 1(B) is an elevation of the metal electrode layer 101. The light-transmitting metal electrode in the present invention comprises a metal electrode layer provided with fine openings 103, and the metal electrode layer comprises a metal part 102 and the fine openings 103 penetrating through the metal part. The metal electrode layer can function as an electrode and at the same time can transmit light in the visible wavelength region.

The light-transmitting metal electrode used in the present invention is characterized in that the transparency is more than expected from the total area occupied by the openings in the metal part 102, and in other words, is characterized in that the reflection essentially ascribed to the metal part 102 is fundamentally reduced to transmit light.

The above light-transmitting metal electrode layer is provided with openings which have an average opening diameter of 10 nm to 780 nm and which are arranged so periodically that the distribution of the arrangement is represented by a radial distribution function curve having a half-width of 5 nm to 300 nm, and thereby can have light-transparency although made of a metal. There are roughly two reasons for this.

One is that, when the electrode is exposed to light, movement of free electrons induced by the electric field of the light is inhibited, so that the electrode is transparent to the light. The other is that, since the openings have diameters much smaller than the wavelength of light, effects of Rayleigh scattering and diffraction are reduced to keep straightforwardness of the light.

Here, the term "wavelength of light" means a wavelength of light incident on the light-transmitting electrode when the electrode is used. Accordingly, the wavelength can be selected in a wide range, but is in the visible wavelength region of 380 nm to 780 nm.

The first theoretical basis is then described below. The Drude theory described above is based on the assumption that the object substance is homogeneous and sufficiently large as compared with the wavelength of incident light. When light having a frequency lower than the plasma frequency is applied to the substance, free electrons in the substance are polarized by the electric field of the light. The polarization is induced in such direction that the electric field of light may be cancelled. The electric field of light is thus shielded by the induced polarization of electrons, so that the light does not penetrate into the substance and thus, what is called, "plasma reflection" is observed. If the substance in which electrons are induced to be polarized is sufficiently small as compared with the wavelength of light, it is thought that the movement of electrons is restricted by the geometrical structure and, as a result, that the electric field of light cannot be shielded.

As described above, in the present invention, the response of substance to light is considered from the viewpoint of inhabitation of free electron movement by a hyperfine structure, and thereby the structure isotropically transmitting the electric field of light, as shown in FIG. 1, is proposed. The inventors have been studied that structure. As a result, it is found that the electrode composed of a metal part and openings, as a whole, can transmit all directions of polarized light if the openings have an average opening diameter of 10 nm to 780 nm and are arranged so periodically that the distribution of the arrangement is represented by a radial distribution function curve having a half-width of 5 nm to 300 nm. On the other hand, any pair of point-positions in the metal part is continuously connected, namely the metal part is seamless. In other words, the metal part as a whole continues although the openings are provided therein, and thereby the function as an electrode is ensured while the resistivity is enough increased, according to the volume ratio of the openings, to keep a relatively high electrical conductivity.

It has been hitherto very difficult to produce completely evenly the above structure. However, the inventors have found that, only if the openings have an average opening diameter of 10 nm to 780 nm and are arranged so periodically that the distribution of the arrangement is represented by a radial distribution function curve having a half-width of 5 nm to 300 nm, the transparency to light is ensured to achieve the object of the present invention.

For analyzing and confirming that the above structure is formed in the metal electrode layer, the following method can be adopted. The image of the surface observed by a scanning electron microscopy or atomic force microscopy is subjected to Fourier transform, and the correlation wavelength and the correlation function are plotted on X- and Y-axes, respectively. The correlation function plotted on Y-axis indicates periodicity of the continuous structure. That is to say, it indicates how much the structure imaged in the micrograph contains moieties having the repeating unit of a particular wavelength.

The second theoretical basis, which concerns straightforwardness of light maintained by reduction of scattering effects and by avoidance of diffraction, is then described below.

The present invention is aimed to reduce scattering effects and thereby to improve the efficiency of straightforwardness of light, and hence it is necessary to treat sizes perturbing the incident light as parameters when the surface structure is defined. From this viewpoint, it is found that the diameter of the opening is most properly determined by the radius of gyration of the opening structure and thereby that the efficiency of straightforwardness of light can be most properly represented. That is to say, the radius of the opening in the surface structure according to the present invention is defined as its radius of gyration, and accordingly the diameter is double the radius of gyration. Even if the openings have different shapes, the same effect of the invention can be obtained as long as the radii of gyration are the same. The radius of gyration is described in, for example, Iwanami Rikagaku Jiten (Iwanami's Dictionary of Physics and Chemistry, written in Japanese) $5^{th}$ edition.

In the present invention, the radius of gyration of the opening is defined as follows. On an image of the opening, circular lines at equal intervals are drawn from the edge. In concrete, on a relief image obtained by atomic force microscopy, circular lines at equal intervals are drawn from the edge. The thus-obtained lines are image-processed to obtain the center of gravity. The distance from the center of gravity to the concavity is then determined, and is processed together with the moment to calculate the radius of gyration R. The radius of gyration can be also obtained by Fourier transform of the electron or atomic force micrograph.

The larger the surface structure is, the more light is scattered. The effect of light-scattering is in proportion to the square of the size. Accordingly, the average radius of gyration R of the openings is preferably not more than ⅙ of the wavelength of incident light. That is to say, the average diameter of the openings is preferably not more than ⅓ of the wavelength of incident light. As long as the above conditions are satisfied, the shapes of the openings are not particularly restricted. Examples of the opening shapes include cylindrical shape, conical shape, triangular pyramidal shape, quadrilateral pyramidal shape, and other columnar or pyramidal shapes. Two or more shapes may be mixed. Even if the light-transmitting metal electrode according to the present invention contains various sizes of openings, the effect of the invention can be obtained. It is, on the contrary, rather preferred that the openings have various sizes because the metal part with those openings is apt to continue linearly in a relatively long straight distance. In the case like the above, where the openings have various sizes, the diameters of the openings can be represented by the average.

Diffraction of light incident on the light-transmitting metal electrode used in the present invention is then described below. When light penetrates from the organic EL layer-side to the metal electrode-side, the scalar theory tells us as follows. The condition for causing diffraction is expressed by the following formula (2):

$$n_m \times \sin \theta_m - n_i \times \sin \theta_i = m \times \lambda / d \quad (2)$$

in which $\theta_m$ is an emission angle from the metal electrode, $\theta_i$ is an incident angle from the organic EL layer-side, $\lambda$ is a wavelength of incident light, d is an interval of diffraction grating, m is a diffraction order of integer (m=0, ±1, ±2, ...), and $n_i$ and $n_m$ are refractive indexes of the organic EL layer and a medium out of the metal electrode such as the transparent substrate, respectively. Accordingly, the condition for not causing diffraction is that the formula (2) does not have a solution when the diffraction order is the minimum: m=−1. This means that the condition is $\lambda/n_i < 1$, and hence the ratio of the wavelength of incident light per the refractive index of the transparent substrate is the threshold. The refractive index of organic EL layer generally used is not more than 2.0, and therefore the diffraction can be avoided if the intervals among the openings are not more than ½ of the wavelength of incident light. The openings are, therefore, preferably thus arranged.

The above openings are included in plural microdomains neighboring each other. The openings placed in each microdomain are arranged periodically, but the microdomains are so placed that the arranging direction of the openings in each microdomain is oriented at random. Otherwise, the openings are preferably arranged completely at random. According to the first theoretical basis, the reason for this can be explained as follows. For example, if the openings are arranged long-periodically in hexagonal symmetry, the metal part has areas periodically continued in tri-axial directions and therefore cannot inhibit the movement of free electrons isotropically. In the present invention, since the openings are arranged in a microdomain structure or in a random structure, the movement of free electrons can be effectively inhibited.

For analyzing and confirming relative positions of the openings, the following method can be adopted. For example, an electron or atomic force micrograph of the metal layer having the openings is subjected to two-dimensional Fourier transform to obtain, what is called, a "reciprocal lattice space image". If the relative arrangement of the openings has periodicity, there are clear spots in the reciprocal lattice space image. In contrast, if the openings are relatively positioned isotropically, a ring is observed.

The process of producing the above light-transmitting metal electrode is then described. In the case where EB (electron beam) lithography system or exposure system is used to form the openings, it is easy to produce a long-periodical structure having regular arrangement of the openings but it is difficult to produce a structure having the openings arranged randomly. On the other hand, however, in the present invention, a phase-separated form of block-copolymer is used as a template. The block-copolymer in the phase-separated form gives openings relatively positioned isotropically in completely random arrangement, and hence is suitable for manufacturing the light-transmitting metal electrode used in the present invention.

The following description is based on the result that a metal electrode having fine openings was produced and measured in practice. The electrode needs to comprise the metal part which continues linearly without breaks by the openings in a straight distance of not more than ⅓ of the wavelength of light. However, from the viewpoint of microfabrication, the openings preferably have an average diameter of 10 nm or more. If the average diameter is smaller than that, it is often difficult to produce a light-transmitting metal electrode excellent in transparency.

The light-transmitting metal electrode provided with the above openings was formed by an aluminum vapor-deposition process in which a block-copolymer layer was used as a template and the template was lifted off after the deposition. The process in the present invention can give a large pattern having openings of 100 nm or less, which cannot be obtained according to conventional photo or electron beam lithographic processes. Needless to say, if the photo or electron beam lithographic processes are improved to produce the similar structure in the future, it can have the same function as the light-transmitting metal electrode according to the present invention.

In the present embodiment, a diblock copolymer mainly comprising aromatic polymer and acryl polymer in combination is used. As described below, however, the combination is not particularly restricted as long as one component of the block copolymer can be selectively removed.

The reason why the diblock copolymer of aromatic polymer and acryl polymer in combination was used in the present embodiment is that these two polymers have large difference in dry-etching resistance. The theoretical basis thereof is disclosed in U.S. Pat. No. 6,565,763. Examples of the aromatic polymer include polystyrene, polyvinyl naphthalene, polyhydroxystyrene, and derivatives thereof. Examples of the acryl polymer include polyalkylmethacrylates such as polymethylmethacrylate, polybutylmethacrylate and polyhexylmethacrylate; polyphenylmethacrylate, polycyclohexylmethacrylate and derivatives thereof. Instead of these methacrylates, acrylates can be used to obtain the same effects. Among the above, diblock polymer of polystyrene and polymethylmethacrylate is preferred in view of dry-etching resistance.

In order to use the block copolymer as a template in a process of the present invention, the copolymer is required to form a self-assembled dot-shaped pattern in nano-scale. Accordingly, from the morphological viewpoint, it is most preferred that the block copolymer have a phase-separated form in dot structure.

The self-assembled block copolymer is not always automatically phase-separated and aligned. Actually, patterns in a short range are aligned in the same direction to form grains. The block copolymer is subjected to thermal annealing at a temperature higher than the glass transition point of the block polymer, and thereby the gains grow gradually. It is already reported by the past study (C. Harrison, et. al., Physical Review E, 66, 011706 (2002)) that the growing rate is in proportion to the ¼ power of the growing time. This means that annealing for only a few hours is enough for the aligned grains to grow to be several microns long.

The inventors have found a method to obtain a block-copolymer in the phase-separated form of a dot pattern having a period of 50 to 70 nm. The aligned dot pattern is transferred to the substrate by the process described below. Thereafter, a metal electrode is deposited onto the transferred structure, and then the area of the transferred pattern is removed to obtain a light-transmitting metal electrode usable in the organic EL element.

Further, for producing the light-transmitting metal electrode usable in the present invention, a silica-monoparticle layer in which plural microdomains are arranged independently of each other can be used as an etching mask.

First, a substrate is prepared. If necessary, an organic polymer layer (resist layer) is coated thereon in a thickness of 50 to 150 nm. The organic polymer layer is preferably provided so as to improve the aspect ratio of mask pattern in etching the substrate.

If necessary, another organic polymer layer is further coated in a thickness of 20 to 50 nm on the above organic polymer layer. The organic polymer layer further provided functions as a trap layer that captures a monolayer from a multilayered layer formed by coating a dispersion solution of silica fine particles, as described below.

On the thus-treated substrate, a dispersion solution in which fine silica particles having a particular grain distribution are dispersed is spin-coated. The fine silica particles are apt to self-assemble so that they may form a closed-packed multilayered layer. Actually, however, they are not closed-packed completely and hence form some "gaps", which will be borders of the microdomains, namely, grain boundaries in the resultant electrode. Thereafter, the coated substrate is heated, and thereby silica particles at the bottom of the multilayered layer are sunk into the organic polymer layer. Successively, the coated substrate is cooled to room temperature, so that the silica particles only at the bottom are captured in the organic polymer layer on the substrate. The coated substrate is then subjected to supersonic wave washing, to remove silica particles other than the particles captured in the polymer layer. Thus, the substrate before etching is obtained.

The substrate is then subjected to an etching process utilizing $CF_4$, and thereby the captured fine silica particles are made smaller to expand the gaps among the particles. The etching process utilizing $CF_4$ is thus carried out to reduce the size of silica particles so that the silica particles may have a size suitable for forming the openings in a desired size. Accordingly, the etching process is preferably conducted under such conditions that the organic polymer layer is hardly dry-etched. After the silica particles are made to have an aimed size, the layer-provided substrate is dry-etched by $O_2$-RIE to form a dot pattern on the substrate. On the dot pattern, a metal is deposited to form a metal electrode layer. For example, a metal is vaporized and deposited to form the metal electrode layer. After the metal is deposited, the polymer is removed, for example, by supersonic wave washing. Thus, a light-transmitting metal electrode is obtained.

Otherwise, after the steps of arranging the silica particles to form a monolayer and making the particles smaller, the monolayer of silica particles can be transferred to the organic polymer layer (resist layer) and then the etching process may be performed to form a pattern.

Further, it is also possible to produce a master plate as a stamper by the above steps before the metal is deposited. The stamper thus-obtained can be used in a nano-imprint process to transfer the pattern, on which a metal is then deposited to produce a light-transmitting metal electrode. According to this method, it is possible to omit the etching process, which is relatively complicated, and hence to produce the electrode efficiently.

In view of light-transparency, the part of the light-transmitting metal electrode is preferably made of a metal having a plasma frequency higher than the frequency of incident light. Further, the metal preferably has a resistivity as low as possible so that the organic EL element can have high efficiency. Accordingly, the metal part of the electrode is preferably made of at least one metal selected from the group consisting of aluminum, gold, silver, copper, indium, magnesium, lithium, scandium, calcium, nickel, cobalt and platinum.

Organic EL Display

FIG. 2 shows an example of a top emission type organic EL display of active-matrix driving system according to one embodiment of the present invention. Needless to say, the structure shown in FIG. 2 is nothing but a representative example for explaining one embodiment of the present invention, and hence it by no means restricts the organic EL display of the present invention.

The organic EL display shown in FIG. 2 has a top-emission type structure, and hence emits light from the surface on the side opposite to the substrate 201. Accordingly, the substrate 201 does not need to be transparent, and hence is not particularly restricted as long as it serves as a support of the pixels. The substrate 201 can be a glass substrate, a Si substrate, a plastic substrate or the like. Among them, a glass substrate is particularly preferred since the display can be easily upsized.

On the periphery of the substrate 201, a pixel-driving circuit unit 202 comprising an image-signal driving circuit, a scanning-signal driving circuit and the like is provided. Further, on the substrate 201, plural pixels 203 connecting to the pixel-driving circuit unit 202 are arranged in the form of a matrix. Each pixel 203 is composed of an element-control circuit, for example, connected to another in series between a pair of power terminals, of an output switch, of a pixel switch, and of a light-emitting part comprising a first electrode, a second electrode and at least one organic layer provided between them. The element-control circuit has a control terminal connected to an image-signal line via the pixel switch. When image signals are sent from the image-signal driving circuit through the image-signal line via the pixel switch, the element-control circuit outputs an electric current according to the image signals into the light-emitting part via the output switch. On the other hand, the pixel switch has a control terminal connected to a scanning-signal line, and is controlled to be turned on/off by scanning signals sent from the scanning-signal driving circuit through the scanning-signal line. The output switch also has a control terminal connected to the scanning-signal line, and is controlled to be turned on/off by the scanning signals sent from the scanning-signal driving circuit through the scanning-signal line. Needless to say, this structure of display is nothing but a representative example for explaining the present invention, and hence it by no means restricts of the present invention. Accordingly, the pixel-driving circuit unit and the pixels may have other structures.

In the following description, the aforementioned pixel 203 is explained in detail with FIG. 3 referred to. FIG. 3 is a typical sectional view of the pixel 203, and of course, it by no means restricts of the present invention. On the substrate 201, an undercoating layer 204 can be formed by depositing $SiN_x$, $SiO_x$ or the like. On the undercoating layer 204, a top-gate type TFT (thin film transistor) is provided. The top-gate type TFT comprises: a semiconductor layer 205, for example, which is made of polysilicon and on which a channel area, a source area and a drain area are formed; a gate-insulating layer 206 prepared by using, for example, TEOS (tetraethoxysilane); and a gate electrode 207 made of, for example, MoW; superposed in this order. The TFT is employed in the pixel switch, in the output switch and in the element-control circuit. On the gate-insulating layer 206, the scanning-signal line is formed in the same manner as the gate electrode 207 is formed.

Further, an interlayer dielectrics layer 208 is formed, for example, from $SiO_x$ by the CVD method on the gate-insulating layer 206 including the gate electrode. On the inter-layer insulating layer 208, a source electrode 209 and a drain electrode 210, each of which may have a three-layered structure of Mo/Al/Mo, are provided. These electrodes are connected to the source area and the drain area in the TFT, respectively, through contact holes formed in the inter-layer insulating layer 208. The image-signal line, which can be formed in the same manner as the source electrode 209 and the drain electrode 210 are formed, is also provided on the inter-layer insulating layer 208. Further, a passivation layer 211 made of, for example, $SiN_x$ is formed on the interlayer dielectrics layer 208 including the source electrode 209 and the drain electrode 210.

On the passivation layer 211, a first electrode 212 is provided. The first electrode 212 is electrically connected to the drain electrode 210 via a through hole formed in the passivation layer 211. The first electrode 212 serves as an anode, and has a function of injecting positive holes into the organic layer. Accordingly, the first electrode is preferably made of a material having a work function of 4.0 eV or more. Examples of the materials include indium oxide-tin alloy (ITO), tin oxide, zinc oxide, metals such as gold, silver, platinum and copper, oxides thereof, and mixtures thereof. Among them, ITO is particularly preferred since it has a work function as large as 5.0 eV. The thickness of the anode is not particularly limited, as long as the anode is formed on the interface to the organic layer 214 so that positive holes can be injected into the organic layer. Normally, however, the anode has a thickness of 5 nm to 200 nm. The first electrode may be such a transparent ITO single layer as to lead light to a light-extraction layer or a reflecting layer provided on the substrate side, or otherwise may be a multilayered film of, for example, ITO/Ag/TIO, which has both light-reflectivity and high electrical conductivity.

Furthermore, a pixel partition layer 213 is provided on the passivation layer 211 including the first electrode 212, to form partitions among the pixels. The pixel partition layer 213 can be prepared from, for example, a photosensitive acrylic resin by normal exposure patterning.

On the first electrode 212 including the pixel partition layer 213, an organic layer 214 having a layered structure of one or more organic layers including an active layer is formed. Here, the term "active layer" means a layer where positive holes and electrons are combined. The organic layer 214 can be made of a luminous material of R, G or B according to color of each pixel. In addition to the active layer, the layered structure may comprise various organic layers such as a hole transfer layer, an electron transfer layer, an electron injection layer and a hole-blocking layer, so as to improve combination efficiency between the positive holes and the electrons. There is no particular restriction on the materials of the active layer, the hole transfer layer and the electron transfer layer. The materials may be compounds of low molecular weights or high molecular weights, and any materials normally used for the active layer, the hole transfer layer and the electron transfer layer in known organic EL elements can be used.

Examples of the materials for the active layer include: tris(8-quinolinol)aluminum complex ($Alq_3$), bisdiphenylvinylbiphenyl (BDPVBi), 1,3-bis(p-t-butylphenyl-1,3,4-oxadiazolyl)phenyl (OXD-7), N,N'-bis(2,5-di-t-butylphenyl) perylene tetracarboxylic diimide (BPPC), and 1,4-bis(p-tolyl-p-methyl-styrylphenylamino)naphthalene. Examples of the materials for the hole transfer layer include: bis(di(p-tolyl)aminophenyl)-1,1-cyclohexane; tetradiphenyldiamine (TPD); triphenyldiamines such as N,N'-diphenyl-N,N'-bis-(1-naphthyl)-1,1'-biphenyl)-4,4'-diamine (a-NPD); and starburst type molecules. Examples of the materials for the electron transfer layer include: oxadiazole derivatives such as 2-(4-biphenylyl)-5-(4-t-butylphenyl)-1,3,4-oxadiazole (Bu-PBD) and OXD-7; triazole derivatives; and metal complexes of quinolinol type. The thickness of the organic layer is not particularly restricted, but is normally and preferably in the range of 0.01 μm to 1 μm.

On the organic layer 214 including the pixel partition layer 213, a second electrode 215 is provided. The second electrode 215 is electrically connected, via a through hole formed in the pixel partition layer 213 and the passivation layer 211, to a wiring formed on the same layer as the image-signal line is provided. The second electrode 215 serves as a cathode, and has a function of injecting electrons into the organic layer. Accordingly, the metal part of the second electrode is preferably made of a material having a small work function. The present invention is characterized in that the second electrode 215 is a light-transmitting metal electrode having the structure shown in FIG. 1. Since the light-transmitting electrode is adopted as the second electrode 215, a highly efficient organic EL display can be obtained. The light-transmitting metal electrode can function as an electrode and at the same time can transmit light in the visible wavelength region. The transparency of the metal electrode is more than expected from the total area occupied by the fine openings 103 in the metal part. As a result, the electrode has a higher transmittance than a normally used semi-transparent metal electrode, so that a very bright and highly efficient organic EL display can be produced. Because of high efficiency, the resultant organic EL display has a long working lifetime.

The second electrode 215 does not need to be a single layer, and may have a multilayered structure in which plural metal electrode layers 101 made of different metals are superposed. For example, first a metal having a small working function is deposited on the interface to the organic layer 214, so as to efficiently inject electrons into the organic layer 214. Thereafter, another metal is deposited thereon to form a two-layered structure, and then the aforementioned fine openings 103 are formed therein. Further, since electrons cannot be injected from the openings, an electron diffusion layer may be inserted between the organic layer 214 and the electrode 215. Furthermore, a transparent thin metal layer having a thickness of a few nanometers may be formed on the organic layer 214, and then the metal electrode layer 101 having the fine openings 103 may be overlaid thereon to produce the multilayered second electrode 215. It is also possible to change the average opening diameter of the fine openings 103 according to whether the pixel is R, G or B.

In the case where the fine openings 103 are filled with a material, the material is not particularly restricted as long as it is transparent. For example, even if the openings are filled with substances such as dielectrics, the effect of the present invention is not impaired. Thus, the light-emitting part 218 composed of the first electrode 212, the organic layer 214 and the second electrode 215 is formed.

Further, a sealing substrate 219 is placed face to face with the light-emitting part 218, and a sealing layer (not shown) is provided around the sealing substrate. In this way, a sealed space is formed between the light-emitting part 218 and the sealing substrate 219. The sealed space is filled with, for example, a rare gas such as Ar gas or an inert gas such as $N_2$ gas, to protect the light-emitting part 218 from deterioration caused by moisture or the like. In addition, a color filter for improving contrast or a means for improving light-extraction such as a light-scattering layer may be provided between the light-emitting part 218 and the sealing substrate 219.

As described above, an organic EL display in which a conventional electrode is replaced with the light-transmitting metal electrode according to the present invention has excellent characteristics. The light-transmitting metal electrode of the present invention can serve either as an anode or as a cathode. However, in consideration of the structure of the display, the light-transmitting metal electrode is preferably placed on the light-emitting side.

Organic EL Lighting Device

Figure 4:
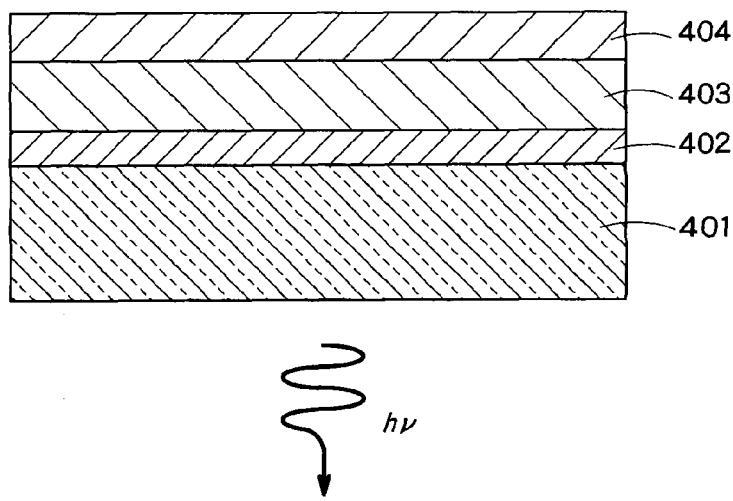
FIG. 4 schematically illustrates a sectional view of an organic EL lighting device according to one embodiment of the present invention.

FIG. 4 shows an example of an organic EL lighting device according to one embodiment of the present invention. Needless to say, the structure shown in FIG. 4 is nothing but a representative example for explaining one embodiment of the present invention, and hence it by no means restricts the organic EL lighting device of the present invention.

The organic EL lighting device shown in FIG. 4 comprises a transparent substrate 401, an anode 402, a cathode 404, and a light-emitting layer 403 placed between the electrodes. In the shown lighting device, since light emitted from the light-emitting layer is given off from the transparent substrate side, the substrate preferably has transparency as high as possible. The transmittance of the substrate is preferably 80% or more, further preferably 90% or more. Accordingly, the substrate is made of glass or plastics. In addition to the light-emitting layer 403, a hole injection layer (hole transfer layer) or an electron injection layer (electron transfer layer) can be formed between the electrodes. In some embodiments of the present invention, the organic EL lighting devices may comprise representative layered structures such as:

1) light-transmitting metal electrode (anode)/light-emitting layer/electrode (cathode), 2) light-transmitting metal electrode (anode)/light-emitting layer/electron injection layer/electrode (cathode), 3) light-transmitting metal electrode (anode)/hole injection layer/light-emitting layer/electron injection layer/electrode (cathode), and 4) light-transmitting metal electrode (anode)/hole injection layer/light-emitting layer/electrode (cathode).

In the present invention, the light-transmitting metal electrode serves as an anode. On the light-transmitting metal electrode 402, the hole injection layer and, if necessary, the electron injection layer are formed by vacuum deposition or by coating. The electron injection layer and the hole injection layer individually have a function of injecting electric charges, of transferring electric charges or of obstructing electric charges. These layers can be made of organic or inorganic materials, and each layer preferably has a thickness of 10 to 300 nm.

The cathode 404 does not need to be transparent. On the contrary, the cathode is preferably reflective rather than transparent. Accordingly, it is generally made of a metal having a small work function. Examples of the metal include aluminum, magnesium, indium, silver or alloys thereof. The cathode 404 preferably has a thickness of 10 to 500 nm.

In the light-emitting layer, electrons and positive holes are recombined to emit light. Any known light-emitting layer can be used according to the desired conditions such as the wavelength of light thrown by the lighting device. For example, a white organic EL lighting device can be produced in the following manner.

First, an aqueous solution of PSS (polystyrene sulfonic acid):PEDOT (polyethylene dioxide thiophene) is spin-coated on the light-transmitting metal electrode, to form a hole injection layer of about 50 nm thickness. On the hole injection layer, α-NPD (4,4-bis[N-(1-naphthyl)-n-phenylamino]biphenyl) is deposited by vapor-deposition to form a hole transfer layer of about 50 nm thickness. On the hole transfer layer, a blue light-emitting layer of about 10 nm thickness is formed by co-deposition. The blue light-emitting layer is made of CBP (4,4'-N,N'-dicarbazol-biphenyl) doped with 10% FIrpic (iridium(III) bis(4,6-di-fluorophenyl)pyridinato-$N,C^2$)picolinate), which is a blue light-emitting material. Thereafter, a red light-emitting layer of about. 10 nm thickness is formed thereon by co-deposition. The red light-emitting layer is made of CBP doped with 10% Btp2Ir(acac) (bis(2-(2'-benzo[4,5-a]thienyl)-pyridinato-$N,C^2$) iridium (III) (acetylacetonato), which is a red light-emitting material. Successively, a yellow light-emitting layer of about 10 nm thickness is formed thereon by co-deposition. The yellow light-emitting layer is made of CBP doped with 10% Bt2Ir (acac), which is a yellow light-emitting material. Because of these blue, red and yellow light-emitting layers, the device can give off white light. Furthermore, on the light-emitting layers, BCP (2,9-di-methyl-4,7-diphenyl-1,10-phenanthroline) is deposited by vapor-deposition to form an electron transfer layer of about 50 nm thickness. Finally, LiF/Al is deposited by vapor deposition to form a cathode of about 150 nm thickness.

In the above manner, a white organic EL lighting device can be formed by vapor-deposition. However, the lighting device can be also produced by coating. The process for producing the lighting device by coating is explained below.

First, an aqueous solution of PSS:PEDOT is spin-coated on the light-transmitting metal electrode, to form a hole injection layer of about 50 nm thickness. On the hole injection layer, a solution of FIrpic, Btp2Ir(acac) and Bt2Ir(acac) dispersed in PVK (polyvinylcarbazole) is spin-coated to form a light-emitting layer of about 100 nm thickness. Since the blue, red and yellow light-emitting materials are dispersed in the PVK, the formed light-emitting layer give off while light. On the light-emitting layers, BCP is deposited by vapor-deposition to form an electron transfer layer of about 50 nm thickness. Thereafter, Alq3 (8-hydroxyquinoline aluminum) is deposited thereon by vapor-deposition to form an electron injection layer of about. 20 nm thickness. Finally, Mg:Ag is deposited by co-deposition to form a cathode having a thickness of about 150 nm.

Formation of Light-Transmitting Metal Electrode

In the present invention, it is necessary to form a light-transmitting metal electrode provided with a pattern having fineness beyond the resolution limit of generally performed lithography. For forming the pattern, it is preferred to adopt a lithographic process in which a phase-separated structure of block copolymer or a monolayer is used as a mask. The light-transmitting metal electrode in the organic EL lighting device can be formed, for example, by lift-off lithography. The concrete procedures thereof are then explained below with FIG. 5 referred to.

First, an organic polymer layer 501 having a thickness of 50 to 150 nm is formed by coating on a transparent substrate 401 (FIG. 5(a)). On the formed organic polymer layer, an inorganic substance layer 502 having a thickness of 5 nm to 30 nm is provided (FIG. 5(a)). The inorganic substance layer serves as an etching mask when the underlying organic polymer layer 501 is subjected to oxygen plasma etching. The organic polymer layer 501 is easily dry-etched by oxygen plasma, but the inorganic substance layer has high resistance against the etching only if made of properly selected inorganic substance. Consequently, an etching mask having a high aspect ratio can be formed, and thereby the lift-off lithographic process can be easily performed thereafter. On the inorganic substance layer, a block copolymer layer 503 is then formed. The sample is then annealed on a hot plate or in an oven, and thereby the block copolymer is phase-separated to form a dot pattern of microdomains 504 (FIG. 5(a)).

After the block copolymer is phase-separated, if one polymer component of the copolymer can be removed by etching more easily than the other, a nano-scale pattern of polymer domains formed by the remaining and aligned component can be used as an etching mask. Accordingly, a diblock copolymer composed of an aromatic component and an acrylic component is preferred because high etching contrast is obtained between those components. For example, since polystyrene and polymethyl methacrylate have very different etching rates in RIE, a block copolymer composed of these components is phase-separated to form polystyrene domains, which can be selectively left to obtain an etching mask.

Thus, one phase of the block polymer is selectively removed to form a dot pattern, which is then used as a mask in etching the inorganic substance layer 502 (FIG. 5(b)). The inorganic substance layer 502 is dry-etched by RIE with $CF_4$, $CHF_3$ or a mixture thereof. Thereafter, the patterned inorganic substance layer 502 is used as a mask in etching the organic polymer layer by oxygen RIE. Since the inorganic substance is not dry-etched by oxygen plasma, very high etching contrast is obtained between the inorganic substance layer 502 and the underlying organic polymer layer 501 to form a dot-pattern having a high aspect ratio (FIG. 5(c)).

After the dot-pattern is transferred onto the organic polymer layer, a metal is deposited thereon by vapor-deposition to form a metal electrode layer 505 (FIG. 5(d)). As shown in FIG. 5(e), the polymer layer 501 is removed after the metal electrode layer is provided, to obtain a light-transmitting metal electrode according to one embodiment of the present invention. In this process, the inorganic substance layer serves as an etching mask when the underlying organic polymer layer is dry-etched, for example, oxygen plasma etching. For the purpose of that, silicon, silicon nitride or silicon oxide, for example, is deposited to form the inorganic substance layer. Otherwise, siloxene polymer, polysilane or spin-on glass, for example, is spin-coated to form the inorganic substance layer serving as an effective mask in the oxygen plasma etching.

The process described above is for producing a light-transmitting metal electrode used in the organic EL lighting device. However, in the same manner, a light-transmitting metal electrode usable in the organic EL display instead of the conventional electrode can be also produced.

Further, it is also possible to produce a master plate as a stamper by the above procedures before the metal is deposited. The stamper thus-obtained can be used in a nano-imprint process to transfer the pattern, on which a metal is then deposited to produce a light-transmitting metal electrode. According to this method, it is possible to omit the etching process, which is relatively complicated, and hence to produce the electrode efficiently.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

EXAMPLES

The present invention is further explained by the following concrete examples. Needless to say, those examples by no means restrict the present invention.

Example 1

On a glass substrate, $SiO_2$ and SiN were deposited by the plasma CVD method in thicknesses of 100 nm and 50 nm, respectively, to prepare an undercoating layer. Successively, amorphous silicon was deposited by the plasma CVD method in 50 nm thickness to form a semiconductor layer. After subjected to dehydrogenation annealing, the semiconductor layer was irradiated with excimer laser beams to crystallize the amorphous silicon and thereby to from polysilicon on the area where TFT was to be provided. The area was then dry-etched by photolithography to pattern the polysilicon. Thereafter, $SiO_2$ was deposited to form a gate-insulating layer, and MoW was deposited thereon. The deposited layer was subjected to patterning, to form a gate electrode. After doping, $SiO_2$ was deposited by the plasma CVD method to form an interlayer dielectrics layer. Contact holes to the source area and the drain area were formed by photolithography, and then a source electrode 209 and a drain electrode 210, each of which had a three-layered structure of Mo/Al/Mo, were provided to form a TFT. Further, SiN was deposited by the plasma CVD method to form a passivation layer. After coated with a photosensitive acrylic resin, the passivation layer was dry-etched by photolithography to prepare a through hole connected to the drain electrode. Thereafter, ITO, Ag and ITO were deposited in thicknesses of 10 nm, 100 nm and 10 nm, respectively, by sputtering, and then subjected to patterning to form a first electrode (anode). Further, a photosensitive acrylic resin was coated and subjected to patterning by photolithography, to form a pixel partition layer. The surface of ITO was treated with oxygen plasma.

Successively, according to the color R, G or B of the pixel, α-NPD was deposited by the vapor deposition method in 50 nm thickness to form a hole transfer layer. For forming active and electron transfer layers corresponding to the R pixel, DCB as a dopant and Alq3 as a host material were deposited by the vapor deposition method in 80 nm thickness. For forming active and electron transfer layers corresponding to the G pixel, Alq3 was deposited by the vapor deposition method in 80 nm thickness. For forming active and electron transfer layers corresponding to the B pixel, coumarin 6 as a dopant and Alq3 as a host material were deposited by the vapor deposition method in 80 nm thickness. Further, after LiF was deposited in 5 nm thickness to form an electron transfer layer, MgAg alloy was co-deposited by vacuum deposition at the deposition rate of 10:1 to prepare a MgAg alloy layer of 30 nm thickness. Successively, on the MgAg alloy layer, SiO was deposited by vacuum deposition in 40 nm thickness. After that, perfluoropolyether was deposited by vacuum deposition in 3 nm thickness to treat the SiO layer, and then TPD was further deposited by vacuum deposition in 9 nm thickness. Since the SiO layer was treated with the perfluoropolyether to be hydrophobic, the TPD deposited thereon grew in the form of islands arranged at random, to form a dot-pattern having an average dot size of 60 nm and an average pitch of 75 nm (FIG. 6). The patterned TPD was then used as an etching mask when the SiO layer was dry-etched by $CF_4$ in 5 nm depth, and thereby the SiO layer in the area not covered with the islanded TPD was removed. The area thus dry-etched had a hydrophilic surface having good wettability. The sample was annealed at 100° C., so that the TPD moved to the area having the hydrophilic surface to form a hole pattern having the average opening diameter of 60 nm and the average pitch of 75 nm.

Thereafter, the hole pattern of TPD was used as an etching mask when the SiO layer was dry-etched by $CF_4$ in 30 nm depth, and thereby the SiO layer in the area not covered with the TPD mask was completely removed to bare the surface of the MgAg layer. Even after this etching process, the TPD mask remained about 10 nm thickness. Finally, the MgAg layer was sputtered by Ar gas to be removed in 25 nm depth from the surface. The resulting surface was observed by SEM, and found that fine openings having the average opening diameter of 60 nm and the average pitch of 75 nm were formed in the MgAg layer. Further, the section was also observed by SEM, and found that the MgAg layer of 30 nm thickness consisted of a thin MgAg layer of 5 nm thickness positioned at the interface to LIF and of a thick MgAg layer of 25 nm thickness having the fine openings in its upper part. When the wavelength of light was 550 nm, the corresponding metal part linearly continuing in 180 nm or less occupied about 97% of the whole area. The TPD remaining before Ar sputtering was completely removed after Ar sputtering, but the SiO layer still remained about 10 nm thickness. Finally, the sample was sealed with a sealing substrate and a sealing layer, to obtain a top-emission type organic EL display of Example 1.

Example 2

The procedures of Example 1 were repeated to form layers of the display up to the organic layer. After that, MgAg alloy was co-deposited by vacuum deposition at the deposition rate of 10:1 to prepare a MgAg alloy layer of 5 nm thickness. Thereafter, a positive-type photoresist (THMR IP3250 [trademark], manufactured by Tokyo Ohka Kogyou Co., Ltd.) was spin-coated to form a resist layer of 80 nm thickness, and then an organic spin-on glass (SOG) composition (OCD-T7

5500-T [trademark], manufactured by Tokyo Ohka Kogyou Co., Ltd.) was coated and baked to form a SOG layer of 20 nm thickness. Further, a block polymer composed of polystyrene (PS) (Mw: 78000):polymethylmethacrylate (PMMA) (Mw: 170000) and PMMA (Mw: 1500) were mixed in the weight ratio of 6:4 to prepare a polymer solution, which was then coated and annealed so that the phase-separation pattern of the block polymer was generated.

The phase-separated pattern was dry-etched by oxygen gas, to remove the PMMA phase. The remaining PS was used as an etching mask when the SOG layer was dry-etched by $CF_4$ gas, to transfer the PS pattern onto the SOG layer. The thus-transferred SOG pattern was used as an etching mask when the resist layer was dry-etched by oxygen gas, to bare the surface of the MgAg layer. In this way, resist/SOG-pillars of 90 nm height were formed and arranged at random on the MgAg layer. After that, MgAg alloy was again co-deposited by vacuum deposition at the deposition rate of 10:1 to prepare a MgAg alloy layer of 20 nm thickness. The resist in the pillars was removed by oxygen plasma to form fine openings arranged in reverse to the pattern of the pillars. Thus, a second electrode having the fine openings was formed. The openings in the second electrode had an average opening diameter of about 100 nm, and occupied about 32% of the whole area (FIG. 7). When the wavelength of light was 550 nm, the corresponding metal part linearly continuing in 180 nm or less occupied about 96% of the whole area. Finally, the sample was sealed with a sealing substrate and a sealing layer, to obtain a top-emission type organic EL display of Example 2.

Example 3

The procedures of Example 1 were repeated to form layers of the display up to the organic layer. After that, MgAg alloy was co-deposited by vacuum deposition at the deposition rate of 10:1 to prepare a MgAg alloy layer of 30 nm thickness. Thereafter, a positive-type photoresist (THMR IP3250 [trademark], manufactured by Tokyo Ohka Kogyou Co., Ltd.) was coated and baked to form a resist layer of 80 nm thickness, and then an organic spin-on glass (SOG) composition (OCD-T7 5500-T [trademark], manufactured by Tokyo Ohka Kogyou Co., Ltd.) was coated and baked to form a SOG layer of 20 nm thickness. Further, a block polymer composed of polystyrene (PS) (Mw: 78000):polymethylmethacrylate (PMMA) (Mw: 170000) and PMMA (Mw: 1500) were mixed in the weight ratio of 6:4 to prepare a polymer solution, which was then coated and annealed so that the phase-separation pattern of the block polymer was generated. The phase-separated pattern was dry-etched by oxygen gas, to remove the PMMA phase. The remaining PS was used as an etching mask when the SOG layer was dry-etched by $CF_4$ gas, to transfer the PS pattern onto the SOG layer. The thus-transferred SOG pattern was used as an etching mask when the resist layer was dry-etched by oxygen gas, to bare the surface of the MgAg layer. In this way, resist/SOG-pillars of 90 nm height were formed and arranged at random on the MgAg layer. After that, SOG (OCD-T7 12000-T [trademark], manufactured by Tokyo Ohka Kogyou Co., Ltd.) was coated to bury the pillars therein. The SOG layer in which the pillars were buried was kept dry-etched back by $CF_4$ gas until the resist pillars were bared. The resist in the pillars was removed by oxygen plasma to bare the surface of the MgAg layer in the area where the pillars had been positioned. Further, the MgAg layer was sputtered by Ar gas to be removed in 30 nm depth from the surface. Thus, a second electrode having the fine openings was formed. The openings in the second electrode had an average opening diameter of about 100 nm, and occupied about 32% of the whole area. When the wavelength of light was 550 nm, the corresponding metal part linearly continuing in 180 nm or less occupied about. 96% of the whole area. Finally, the sample was sealed with a sealing substrate and a sealing layer, to obtain a top-emission type organic EL display of Example 3.

Example 4

The procedures of Example 1 were repeated to form layers of the display up to the organic layer. After that, MgAg alloy was co-deposited by vacuum deposition at the deposition rate of 10:1 to prepare a MgAg alloy layer of 30 nm thickness. Thereafter, a photosensitive acrylic resin was coated in 100 nm thickness on the MgAg layer. Independently, a quartz substrate was prepared and coated with positive-working photoresist (THMR IP3250 [trademark], manufactured by Tokyo Ohka Kogyou Co., Ltd.). The photoresist spread on the substrate was baked to form a resist layer of 120 nm thickness, and then an organic spin-on glass (SOG) composition (OCD-T7 5500-T [trademark], manufactured by Tokyo Ohka Kogyou Co., Ltd.) was coated and baked to form a SOG layer of 30 nm thickness. Further, a block polymer composed of PS (Mw: 78000):PMMA (Mw: 170000) and PMMA (Mw: 1500) were mixed in the weight ratio of 6:4 to prepare a polymer solution, which was then coated and annealed so that the phase-separation pattern of the block polymer was generated. The phase-separated pattern was dry-etched by oxygen gas, to remove the PMMA. The remaining PS was used as an etching mask when the SOG layer was dry-etched by $CF_4$ gas, to transfer the PS phase pattern onto the SOG layer. The thus-transferred SOG pattern was used as an etching mask when the resist layer was dry-etched by oxygen gas, to bare the surface of the quartz substrate. In this way, resist/SOG-pillars of 130 nm height were formed and arranged at random on the quartz substrate.

The resist/SOG-pillars were used as an etching mask when the surface of the quartz substrate was dry-etched by mixed gas of $CF_4/CHF_3$ in a depth of 50 nm. Finally, the resist was removed with oxygen plasma, to form a dot-pattern having an average dot size of about 100 nm and a dot area ratio of 32% on the quartz substrate. The quartz substrate thus provided with the dot-pattern was used as a stamper, with which a photosensitive acrylic resin was nano-imprinted onto an organic EL display substrate at a pressure of 0.5 Mpa. The acrylic resin was exposed to UV light to be hardened. In this way, a hole pattern in reverse to the pattern of the stamper was formed in the acrylic resin. The area corresponding to the holes was dry-etched by oxygen gas to bare the bottoms of the holes, and then the MgAg layer was sputtered by Ar gas to be removed in 25 nm depth from the surface. Thus, a second electrode having the fine openings was formed. The openings in the second electrode had an average opening diameter of about 100 nm, and occupied about 32% of the whole area. When the wavelength of light was 550 nm, the corresponding metal part linearly continuing in 180 nm or less occupied about 96% of the whole area. Finally, the sample was sealed with a sealing substrate and a sealing layer, to obtain a top-emission type organic EL display of Example 4.

Comparative Example 1

The procedures of Example 1 were repeated to form layers of the display up to the organic layer. After that, MgAg alloy was co-deposited by vacuum deposition at the deposition rate of 10:1 to prepare a MgAg alloy layer of 15 nm thickness.

A DC voltage of 8 V was applied to each of R, G and B pixels in the displays produced above, to obtain EL light. The luminous flux of each Example was measured in the ratio based on that of Comparison Example 1, and the results were as set forth in Table 1. As a result, the displays of Examples were remarkably improved in brightness, and thereby it was confirmed that highly efficient Organic EL displays were produced.

TABLE 1

|  | R | G | B |
| --- | --- | --- | --- |
| Example 1 | 1.65 | 1.63 | 1.62 |
| Example 2 | 1.53 | 1.52 | 1.49 |
| Example 3 | 1.57 | 1.55 | 1.54 |
| Example 4 | 1.58 | 1.55 | 1.55 |

Example 5

A photoresist (THMR IP3250 [trademark], manufactured by Tokyo Ohka Kogyou Co., Ltd.) was diluted with ethyl lactate by 1:3. The solution was spin-coated at 2000 rpm for 30 seconds on a glass substrate, and then heated on a hot-plate at 110° C. for 90 seconds to evaporate the solvent, and further annealed at 250° C. for 1 hour under nitrogen gas-atmosphere to perform a thermosetting reaction. The layer thus hardened had a thickness of 80 nm.

An organic spin-on glass (SOG) composition (OCD-T7, T-5500 [trademark], manufactured by Tokyo Ohka Kogyou Co., Ltd.) was diluted with ethyl lactate by 1:5. The solution was spin-coated at 3000 rpm for 30 seconds on the above resist-coated substrate, and then heated on a hot-plate at 110° C. for 90 seconds to evaporate the solvent, and further annealed at 250° C. for 1 hour under nitrogen gas-atmosphere. The layer thus formed had a thickness of 20 nm.

Thereafter, 3 wt. % propylene glycol monomethyl ether acetate (PGMEA) solution of polystyrene (PS)-polymethyl-methacrylate (PMMA) diblock copolymer was spin-coated at 2000 rpm for 30 seconds on the above substrate, and then heated on a hot-plate at 110° C. for 90 seconds to evaporate the solvent. In the diblock copolymer, the PS moiety had a molecular weight of 78000 g/mol and the PMMA moiety had a molecular weight of 170000 g/mol. The obtained block copolymer layer had a thickness of 50 nm. The copolymer was annealed at 210° C. for 4 hours under nitrogen gas-atmosphere, so that the phases of PS and PMMA were separated to form microdomains of polystyrene in the form of dots having diameters of 50 to 70 nm.

The obtained block copolymer layer was dry-etched for 8 seconds under the conditions of $O_2$: 30 sccm, 100 mTorr and a RF power of 100 W. As a result of the oxygen etching, a PS dot-pattern was formed. The PS dot-pattern was then used as a mask when the SOG layer was subjected to RIE for 60 seconds under the conditions of $CF_4$: 30 sccm, 10 mTorr and a RF power of 100 W. In this etching process, the PS pattern was transferred onto the SOG layer. Thereafter, the SOG layer was used as a mask when the resist layer was subjected to RIE for 90 seconds under the conditions of $O_2$: 30 sccm, 10 mTorr and a RF power of 100 W. As a result, columnar structures (pillars) of high aspect ratios were formed to obtain a pattern of pillars.

Onto the pattern of pillars, aluminum was deposited in a thickness of 30 nm by vapor-deposition. The columnar resist pattern was then lifted off and removed, and thereby a light-transmitting metal electrode having desired openings was obtained. The produced light-transmitting metal electrode had openings having an average diameter of 50 to 70 nm, and the openings occupied about 32% of the whole area. The resistivity of the layer was 30 μΩ·cm.

Figure 8:
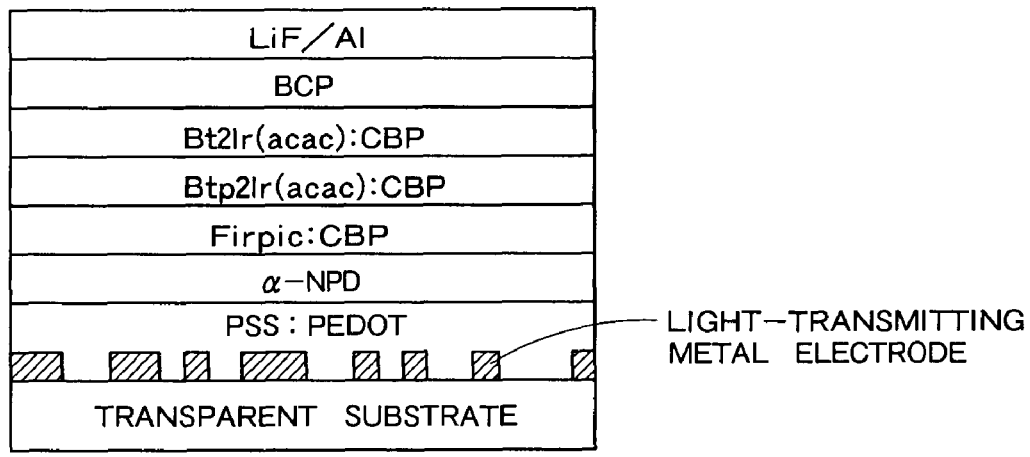
FIG. 8 schematically illustrates a sectional view of the organic EL lighting device produced in Example 5.

Thereafter, an aqueous solution of PSS:PEDOT was spin-coated on the light-transmitting metal electrode, to form a hole injection layer of 40 nm thickness. On the hole injection layer, α-NPD was deposited by vapor-deposition to form a hole transfer layer of about. 20 nm thickness. On the hole transfer layer, a blue light-emitting layer having 10 nm thickness was formed by co-deposition. The blue light-emitting layer was made of CBP doped with 10% FIrpic, which was a blue light-emitting material. Thereafter, a red light-emitting layer having 10 nm thickness was formed thereon by co-deposition. The red light-emitting layer was made of CBP doped with 10% Btp2Ir(acac), which was a red light-emitting material. Successively, a yellow light-emitting layer having 10 nm thickness was formed thereon by co-deposition. The yellow light-emitting layer was made of CBP doped with 10% Bt2Ir(acac), which was a yellow light-emitting material. Furthermore, on these light-emitting layers, BCP was deposited by vapor-deposition to form an electron transfer layer of 40 nm thickness. Finally, LiF (1 nm)/Al (150 nm) was deposited by vapor deposition to form a cathode. Thus, a white organic EL lighting device was produced. FIG. 8 schematically illustrates a sectional view of the produced organic EL lighting device.

With respect to unevenness of brightness, the produced organic EL lighting device was evaluated. As a result, it was found that the difference between brightness at the center and that at the edge was within 10%. The light-transmitting metal electrode serving as an anode had a resistivity lower than ⅓ of the resistivity of ITO, and thereby the lighting device could emit light evenly.

Example 6

The procedures of Example 5 were repeated to form a resist layer, a SOG layer and a block copolymer layer, in this order, on a glass substrate.

The block copolymer layer was dry-etched for 10 seconds under the conditions of $O_2$: 30 sccm, 100 mTorr and a RF power of 100 W. As a result of the oxygen etching, a PS dot-pattern was formed. The PS dot-pattern was then used as a mask when the SOG layer was subjected to RIE for 60 seconds under the conditions of $CF_4$: 30 sccm, 10 mTorr and a RF power of 100 W. In this etching process, the PS pattern was transferred onto the SOG layer. Thereafter, the SOG layer was used as a mask when the resist layer was subjected to RIE for 90 seconds under the conditions of $O_2$: 30 sccm, 10 mTorr and a RF power of 100 W. As a result, columnar structures (pillars) of high aspect ratios were formed to obtain a pattern of pillars.

Onto the pattern of pillars, aluminum was deposited in a thickness of 30 nm by vapor-deposition. The columnar resist pattern was then lifted off and removed, and thereby a light-transmitting metal electrode having desired openings was obtained. The produced light-transmitting metal electrode had openings having an average diameter of 30 to 50 nm, and the openings occupied about 15% of the whole area. The resistivity of the layer was 10 μΩ·cm.

Thereafter, the procedures of Example 5 were repeated to form a hole injection layer, a hole transfer layer, a blue light-emitting layer, a red light-emitting layer, a yellow light-emitting layer, an electron transfer and a cathode. Thus, a white organic EL lighting device was produced.

With respect to unevenness of brightness, the produced organic EL lighting device was evaluated. As a result, it was found that the difference between brightness at the center and that at the edge was within 5%. The light-transmitting metal electrode serving as an anode had a resistivity corresponding to about. 1/10 of the resistivity of ITO, and thereby the lighting device could emit light evenly.

Example 7

The procedures of Example 5 were repeated to form a resist layer, a SOG layer and a block copolymer layer, in this order, on a glass substrate.

The block copolymer layer was dry-etched for 8 seconds under the conditions of $O_2$: 30 sccm, 100 mTorr and a RF power of 100 W. As a result of the oxygen etching, a PS dot-pattern was formed. The PS dot-pattern was then used as a mask when the SOG layer was subjected to RIE for 60 seconds under the conditions of $CF_4$: 30 sccm, 10 mTorr and a RF power of 100 W. In this etching process, the PS pattern was transferred onto the SOG layer. Thereafter, the SOG layer was used as a mask when the resist layer was subjected to RIE for 90 seconds under the conditions of $O_2$: 30 sccm, 10 mTorr and a RF power of 100 W. As a result, columnar structures (pillars) of high aspect ratios were formed to obtain a pattern of pillars.

Onto the pattern of pillars, copper was deposited in a thickness of 30 nm by vapor-deposition. The columnar resist pattern was then lifted off and removed, and thereby a light-transmitting metal electrode having desired openings was obtained. The produced light-transmitting metal electrode had openings having an average diameter of 50 to 70 nm, and the openings occupied about 35% of the whole area. The resistivity of the layer was 20 µΩ·cm.

Thereafter, the procedures of Example 5 were repeated to form a hole injection layer, a hole transfer layer, a blue light-emitting layer, a red light-emitting layer, a yellow light-emitting layer, an electron transfer and a cathode. Thus, a white organic EL lighting device was produced.

With respect to unevenness of brightness, the produced organic EL lighting device was evaluated. As a result, it was found that the difference between brightness at the center and that at the edge was within 10%. The light-transmitting metal electrode serving as an anode had a resistivity corresponding to about. 1/5 of the resistivity of ITO, and thereby the lighting device could emit light evenly.

Example 8

The procedures of Example 5 were repeated to form a resist layer, a SOG layer and a block copolymer layer, in this order, on a glass substrate.

The block copolymer layer was dry-etched for 8 seconds under the conditions of $O_2$: 30 sccm, 100 mTorr and a RF power of 100 W. As a result of the oxygen etching, a PS dot-pattern was formed. The PS dot-pattern was then used as a mask when the SOG layer was subjected to RIE for 60 seconds under the conditions of $CF_4$: 30 sccm, 10 mTorr and a RF power of 100 W. In this etching process, the PS pattern was transferred to the SOG layer. Thereafter, the SOG layer was used as a mask when the resist layer was subjected to RIE for 90 seconds under the conditions of $O_2$: 30 sccm, 10 mTorr and a RF power of 100 W. As a result, columnar structures (pillars) of high aspect ratios were formed to obtain a pattern of pillars.

Onto the pattern of pillars, gold was deposited in a thickness of 30 nm by vapor-deposition. The columnar resist pattern was then lifted off and removed, and thereby a light-transmitting metal electrode having desired openings was obtained. The produced light-transmitting metal electrode had openings having an average diameter of 50 to 70 nm, and the openings occupied about 35% of the whole area. The resistivity of the layer was 35 µΩ·cm.

Thereafter, the procedures of Example 5 were repeated to form a hole injection layer, a hole transfer layer, a blue light-emitting layer, a red light-emitting layer, a yellow light-emitting layer, an electron transfer layer and a cathode. Thus, a white organic EL lighting device was produced.

With respect to unevenness of brightness, the produced organic EL lighting device was evaluated. As a result, it was found that the difference between brightness at the center and that at the edge was within 10%. The light-transmitting metal electrode serving as an anode had a resistivity corresponding to about. 1/3 of the resistivity of ITO, and thereby the lighting device could emit light evenly.

Example 9

The procedures of Example 5 were repeated to form a light-transmitting metal layer on a glass substrate.

Figure 9:
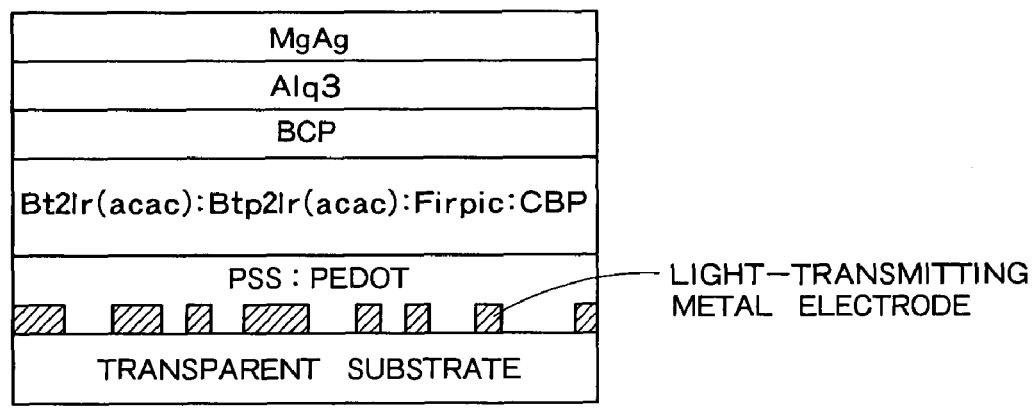
FIG. 9 schematically illustrates a sectional view of the organic EL lighting device produced in Example 9.

Thereafter, an aqueous solution of PSS:PEDOT was spin-coated on the light-transmitting metal electrode, to form a hole injection layer of 40 nm thickness. On the hole injection layer, a solution in which FIrpic, Btp2Ir(acac) and Bt2Ir(acac) in the ratio of 10:0.25:0.25 were dispersed in PVK was spin-coated to form a light-emitting layer of about. 80 nm thickness. Thereafter, BCP was deposited thereon by vapor deposition to form an electron transfer layer of about. 20 nm thickness, and further Alq3 was deposited thereon by vapor-deposition to form an electron injection layer of 20 nm thickness. Finally, Mg:Ag (5%) was deposited by co-deposition to form a cathode of about. 150 nm thickness. Thus, a white organic EL lighting device was produced. FIG. 9 schematically illustrates a sectional view of the produced organic EL lighting device.

With respect to unevenness of brightness, the produced organic EL lighting device was evaluated. As a result, it was found that the difference between brightness at the center and that at the edge was within 10%.

Example 10

In the process performed in the present embodiment, etching procedures were mainly adopted to produce an organic EL lighting device.

On a transparent substrate 401 (glass substrate), aluminum was deposited by vapor deposition to form an aluminum layer 1001 of 30 nm thickness (FIG. 10(*a*)). Independently, a photoresist (THMR IP3250 [trademark], manufactured by Tokyo Ohka Kogyou Co., Ltd.) was diluted with ethyl lactate by 1:3. The solution was spin-coated thereon at 2000 rpm for 30 seconds, and then heated on a hot-plate at 110° C. for 90 seconds to evaporate the solvent, and further annealed at 250° C. for 1 hour under nitrogen gas-atmosphere to perform a thermosetting reaction. The organic polymer layer 501 thus formed had a thickness of 80 nm (FIG. 10(*a*)).

Thereafter, an organic SOG (OCD-T7, T-5500 [trademark], manufactured by Tokyo Ohka Kogyou Co., Ltd.) was diluted with ethyl lactate by 1:5. The solution was spin-coated at 3000 rpm for 30 seconds on the above resist-coated substrate, and then heated on a hot-plate at 110° C. for 90 seconds to evaporate the solvent, and further annealed at 250° C. for 1 hour under nitrogen gas-atmosphere. The SOG inorganic substance layer 502 thus formed had a thickness of 20 nm (FIG. 10(*a*)).

Successively, 3 wt. % propylene glycol monomethyl ether acetate (PGMEA) solution of polystyrene (PS)-polymethylmethacrylate (PMMA) diblock copolymer was spin-coated at 2000 rpm for 30 seconds to form a block copolymer layer 503, and then heated on a hot-plate at 110° C. for 90 seconds to evaporate the solvent. In the diblock copolymer, the PS moiety had a molecular weight of 78000 g/mol and the PMMA moiety had a molecular weight of 170000 g/mol. The obtained block copolymer layer had a thickness of 50 nm. The copolymer was annealed at 210° C. for 4 hours under nitrogen gas-atmosphere, so that the phases of PS and PMMA were separated to form microdomains of polystyrene in the form of dots having diameters of 50 to 70 nm (FIG. 10(a)).

The obtained block copolymer layer was dry-etched for 8 seconds under the conditions of $O_2$: 30 sccm, 100 mTorr and a RF power of 100 W. As a result of the oxygen etching, a PS dot-pattern was formed. The PS dot-pattern was then used as a mask when the SOG layer was subjected to RIE for 60 seconds under the conditions of $CF_4$: 30 sccm, 10 mTorr and a RF power of 100 W. In this etching process, the PS pattern was transferred to the SOG layer (FIG. 10(b)). Thereafter, the SOG layer was used as a mask when the resist layer was dry-etched by RIE for 90 seconds under the conditions of $O_2$: 30 sccm, 10 mTorr and a RF power of 100 W. As a result, columnar structures (pillars) of high aspect ratios were formed to obtain a pattern of pillars (FIG. 10(c)).

Thereafter, an organic SOG (T-12000 [trademark], manufactured by Tokyo Ohka Kogyou Co., Ltd.) was spin-coated at 3000 rpm for 30 seconds on the above resist columnar pattern, to bury the columnar pattern completely. The surface of the sample was thus made flat (FIG. 10(d)). After that, the sample was heated on a hot-plate at 110° C. for 90 seconds to evaporate the solvent.

The SOG layer was subjected to RIE for 8 seconds under the conditions of $CF_4$: 30 sccm, 10 mTorr and a RF power of 100 W, to bare the top surface of the resist columnar pattern. The sample was then further was subjected to etching for 60 seconds under the conditions of $O_2$: 30 sccm, 10 mTorr and a RF power of 100 W to remove the resist. Thus, a hole pattern of SOG was formed (FIG. 10(e)).

The pattern of SOG was used as a mask when the aluminum layer was subjected to RIE for 60 seconds under the conditions of $Cl_2$: 15 sccm, Ar: 15 sccm and a RF power of 100 W. The thus-treated aluminum pattern had openings having an average diameter of 50 to 70 nm, and the openings occupied about 32% of the whole area. The remaining SOG mask was subjected to RIE for 30 seconds under the conditions of $CF_4$: 30 sccm, 10 mTorr and a RF power of 100 W, to be removed (FIG. 10(f)).

Thereafter, the procedures of Example 5 were repeated to form a hole injection layer, a hole transfer layer, a blue light-emitting layer, a red light-emitting layer, a yellow light-emitting layer, an electron transfer and a cathode. Thus, a white organic EL lighting device was produced. The produced lighting device had the same structure as that in Example 5, as shown in FIG. 8.

Example 11

In the process performed in the present embodiment, a monoparticle layer was used as a template to produce an organic EL lighting device.

A thermosetting (THMR IP3250 [trademark], manufactured by Tokyo Ohka Kogyou Co., Ltd.) was diluted with ethyl lactate by 1:3. The solution was spin-coated at 1500 rpm for 30 seconds on a glass substrate, and then heated on a hot-plate at 110° C. for 90 seconds, and further heated at 250° C. for 1 hour oven under nitrogen gas-atmosphere to perform a thermosetting reaction. The layer thus formed had a thickness of about 120 nm.

Thereafter, the thermosetting (THMR IP3250 [trademark], manufactured by Tokyo Ohka Kogyou Co., Ltd.) was again diluted with ethyl lactate by 1:5. The solution was further spin-coated at 3000 rpm for 30 seconds on the above resist-coated substrate, and then heated on a hot-plate at 110° C. for 90 seconds. The resist layer thus formed was dry-etched for 5 seconds under the conditions of $O_2$: 30 sccm, 100 mTorr and a RF power of 100 W by means of a reactive ion etching system. As a result, the top resist layer was hydrophilized enough to have suitable wettability for below-described coating of the dispersion solution.

A dispersion solution of fine silica particles (PL-13 [trademark], manufactured by Fuso Chemical Co., Ltd.) was filtered through a 1 µm mesh filter to prepare a coating solution. The solution was spin-coated at 1000 rpm for 60 seconds on the above resist-coated substrate. After drying, the substrate was annealed on a hot-plate at 220° C. for 30 minutes, so that fine silica particles only at the bottom were sunk into the above hydrophilized resist layer. Thereafter, the substrate was cooled to room temperature, and thereby the resist layer was hardened again to capture the silica particles only at the bottom.

The whole surface of the substrate was then rubbed with unwoven cloth (BEMCOT [trademark], manufactured by Ashahikasei Fibers Corporation) while being washed with pure water, to remove the silica particles other than those at the bottom.

The thus-obtained monolayer of silica particles was dry-etched for 225 seconds under the conditions of $CF_3$: 30 sccm, 10 mTorr and a RF power of 100 W, and thereby the fine silica particles were made smaller to expand the gaps among them. In this etching process, the underlying resist layer was not dry-etched under the above conditions. The etching process was continued until the silica particles had a predetermined size. Thereafter, the remaining silica particles were used as a mask when the underlying thermosetting resist layer was dry-etched by $O_2$-RIE for 105 seconds under the conditions of $O_2$: 30 sccm, 10 mTorr and a RF power of 100 W, and thereby the surface of the substrate in the dry-etched area was completely bared. As a result, columnar structures (pillars) of high aspect ratios were formed in the area where the dry-etched silica particles were positioned, to obtain a pattern of pillars.

Onto the pattern of pillars thus-obtained, aluminum was deposited in a thickness of 30 nm by the resistance heat deposition method. The pattern of pillars was then dry-etched by $O_2$-RIE for 5 minutes under the conditions of $O_2$: 30 sccm, 100 mTorr and a RF power of 100 W, and thereby the resist layer only in the area under the silica particles was dry-etched. This treatment was carried out so that the resist layer in the area of the mask pattern might be easily removed. The pattern was then immersed in water and ultrasonically washed to remove, namely, to lift off the columnar structures. Thus, a light-transmitting metal electrode having desired openings was obtained.

The produced light-transmitting metal electrode had openings having an average diameter of about 100 nm, and the openings occupied about 30% of the whole area. The resistivity of the layer was about. 17 µΩ·cm.

Thereafter, the procedures of Example 5 were repeated to form a hole injection layer, a hole transfer layer, a blue light-emitting layer, a red light-emitting layer, a yellow light-emitting layer, an electron transfer and a cathode. Thus, a white organic EL lighting device was produced. The produced lighting device had the same structure as that in Example 5, as shown in FIG. 8.

With respect to unevenness of brightness, the produced organic EL lighting device was evaluated. As a result, it was found that the difference between brightness at the center and that at the edge was within 10%.

Example 12

This example describes a mass-production method utilizing nano-in-print technology. In this method, the columnar pattern of fine silica particles is used as a mold to produce a Ni-made stamper for nano-imprint.

First, a thermosetting resist (THMR IP3250 [trademark], manufactured by Tokyo Ohka Kogyou Co., Ltd.) was diluted with ethyl lactate by 1:3. The solution was spin-coated at 1500 rpm for 30 seconds on a 6-inch silicon wafer 11, and then heated on a hot-plate at 110° C. for 90 seconds, and further heated at 250° C. for 1 hour under nitrogen gas-atmosphere to perform a thermosetting reaction. The layer thus formed had a thickness of about 120 nm.

The thermosetting resist (THMR IP3250 [trademark], manufactured by Tokyo Ohka Kogyou Co., Ltd.) was again diluted with ethyl lactate by 1:5. The solution was further spin-coated at 3000 rpm for 30 seconds on the above resist-coated substrate, and then heated on a hot-plate at 110° C. for 90 seconds. The resist layer thus formed was dry-etched for 5 seconds under the conditions of $O_2$: 30 sccm, 100 mTorr and a RF power of 100 W by means of a reactive ion etching system. As a result, the top resist layer was hydrophilized enough to have suitable wettability for below-described coating of the dispersion solution.

A dispersion solution of fine silica particles (PL-13 [trademark], manufactured by Fuso Chemical Co., Ltd.) was filtered through a 1 μm mesh filter to prepare a coating solution. The solution was spin-coated at 1000 rpm for 60 seconds on the above resist-coated substrate. After drying, the substrate was annealed on a hot-plate at 220° C. for 30 minutes, so that fine silica particles only at the bottom were sunk into the above hydrophilized resist layer. Thereafter, the substrate was cooled to room temperature, and thereby the resist layer was hardened again to capture the silica particles only at the bottom.

The whole surface of the substrate was then rubbed with unwoven cloth (BEMCOT [trademark], manufactured by Asahikasei Fibers Corporation) while being washed with pure water, to remove the silica particles other than those at the bottom. As a result, a monolayer of silica particles was formed on the resist layer.

The thus-obtained monolayer of silica particles was dry-etched for 225 seconds under the conditions of $CF_3$: 30 sccm, 10 mTorr and a RF power of 100 W, and thereby the fine silica particles were made smaller to expand the gaps among them. In this etching process, the underlying resist layer was not dry-etched under the above conditions. The etching process was continued until the silica particles had a predetermined size. Thereafter, the remaining silica particles were used as a mask when the underlying thermosetting resist layer was dry-etched by $O_2$-RIE for 105 seconds under the conditions of $O_2$: 30 sccm, 10 mTorr and a RF power of 100 W, and thereby the surface of the substrate in the dry-etched area was completely bared. As a result, columnar structures (pillars) of high aspect ratios were formed in the area where the dry-etched silica particles had been positioned, to obtain a pattern of pillars.

Onto the pattern of pillars consisting of the dry-etched silica particles and the resist on the silicon wafer, an electrically conductive layer made of nickel was formed by a sputtering process. Prior to the sputtering procedure, the sputtering chamber was evacuated to $8 \times 10^{-3}$ Pa and then filled with Ar at 1 Pa. The sputtering was carried out for 40 seconds at a DC power of 400 W. As a target of the sputtering, pure nickel was used. The electrically conductive layer thus-obtained had a thickness of 30 nm.

Thereafter, a plated electrically conductive layer was formed by plating for 90 minutes in a nickel (III) sulfamate plating solution (NS-160 [trademark], manufactured by Showa Chemical Industry CO., LTD.), to obtain a master plate. The plating conditions are as follows:

Nickel sulfamate: 600 g/L,
Boric acid: 40 g/L,
Surface active agent (sodium lauryl sulfate): 0.15 g/L,
Temperature of solution: 55° C.,
pH: 4.0, and
Current density: 20 A/dm².

The plated layer thus obtained had a thickness of 0.3 mm. The plated layer was then peeled off from the wafer on which the dry-etched silica and the resist pillars were provided, to obtain a self-supported layer made of plated nickel.

The residual resist and silica attached on the layer can be removed generally by $CF_4$ dry-etching or by oxygen plasma ashing. Accordingly, the surface of the layer obtained above was subjected to oxygen plasma ashing and $CF_4/O_2$ RIE to remove the residue, and further subjected to a punching process to remove burrs. Thus, a stamper for nano-imprint was obtained. Since obtained from a mold of the columnar pattern, the obtained stamper had a hole-pattern comprising innumerable openings. The stamper, onto which the arrangement pattern of fine silica particles was transferred, was used as a master plate of nano-imprint described below.

The thermosetting resist (THMR IP3250 [trademark], manufactured by Tokyo Ohka Kogyou Co., Ltd.) was diluted with ethyl lactate by 1:3. The solution was spin-coated at 2500 rpm for 30 seconds on a glass substrate, and then heated on a hot-plate at 110° C. for 90 seconds to form a resist layer of 120 nm thickness. The coated substrate was then placed on a stage of nano-imprint apparatus, and pressed for 1 minute at 120° C. under 0.5 Mpa with the stamper for nano-imprint to imprint the hole-pattern. Thus, the columnar pattern of resist was formed on the quartz substrate. The resist layer on which the pattern had been thus transferred was then subjected to RIE by $O_2$ gas, so that the residual resist left by the imprint was removed. As a result, the surface of the substrate in the area where the columnar pattern was not positioned was completely bared.

Onto the columnar pattern of resist on the quartz substrate, aluminum was deposited in a thickness of 30 nm by the resistance heat deposition method to form an aluminum layer. The layer was then dry-etched by $O_2$-RIE for 5 minutes under the conditions of $O_2$: 30 sccm, 100 mTorr and a RF power of 100 W. The sample was then immersed in water and ultrasonically washed to remove, namely, to lift off the columnar pattern. Thus, a light-transmitting metal electrode having desired openings was obtained. The peak transmittance of the obtained electrode in the visible region was about. 52%, and the resistivity was about. 19 μΩ·cm.

Thereafter, the procedures of Example 5 were repeated to form a hole injection layer, a hole transfer layer, a blue light-emitting layer, a red light-emitting layer, a yellow light-emitting layer, an electron transfer and a cathode. Thus, a white organic EL lighting device was produced. The produced lighting device had the same structure as that in Example 5, as shown in FIG. 8.

With respect to unevenness of brightness, the produced organic EL lighting device was evaluated. As a result, it was found that the difference between brightness at the center and that at the edge was within 10%. Even after the imprint process, the Ni-made stamper produced in this example was not damaged in the pattern shape and accordingly it was possible to use the sampler for producing the pattern repeatedly.

The invention claimed is:

1. An organic electroluminescence display comprising:
a substrate,
a pixel-driving circuit unit, and
pixels arranged in the form of a matrix on said substrate; wherein
said pixel comprises a light-emitting part including
a first electrode placed near to said substrate,
a second electrode placed far from said substrate, said second electrode including a metal electrode layer having a thickness of 10 nm to 200 nm, and
at least one organic layer placed between said first and second electrodes;
and
said metal electrode layer comprises
a metal part is seamless and formed of metal continuously connected without breaks between any points therein, and
plural openings which penetrate through said layer, which have an average opening diameter of 10 nm to 780 nm and which are arranged so periodically that the distribution of the arrangement is represented by a radial distribution function curve having a half-width of 5 nm to 300 nm.

2. The display according to claim 1, wherein said metal part is made of a material having a plasma frequency higher than the frequency of incident light.

3. The display according to claim 1, wherein
said metal electrode layer is formed from plural microdomains neighboring each other, and
said openings placed in each of said microdomains are arranged periodically, but said microdomains are so placed that the arranging direction of said openings in each microdomain is oriented at random.

4. The display according to claim 1, wherein said openings are positioned at random in said metal electrode layer.

5. The display according to claim 1, wherein said metal part is made of at least one metal selected from the group consisting of aluminum, gold, silver, copper, indium, magnesium, lithium, scandium, calcium, nickel, cobalt and platinum.

6. The display according to claim 1, wherein the peak light-transmittance of said metal electrode layer is not smaller than the mean area ratio of said openings in said metal electrode layer.

7. The display according to claim 1, wherein said metal electrode layer serves as a cathode.

8. The display according to claim 1, wherein said metal electrode layer has a multilayered structure consisting of stacked plural metal electrode layers made of different metals.

9. A process for production of the organic electroluminescence display according to claim 1, comprising:
for producing said second electrode in said pixel,
forming a phase-separated block copolymer layer in the form of a dot pattern of microdomains, and
producing a metal electrode layer having openings by an etching process in which said dot pattern of microdomains is used as a mask.

10. A process for production of the organic electroluminescence display according to claim 1, comprising:
for producing said second electrode in said pixel,
forming an organic polymer layer on a substrate on which the electrode is to be formed,
forming a monolayer of fine particles in the form of a dot pattern of microdomains on said organic polymer layer,
processing said fine particles by etching until the particles have a desired size,
transferring said monolayer of the etching-processed fine particles onto the organic polymer layer, so that columnar structures made of the organic polymer and the etching-processed fine particles are formed on the surface of the substrate,
forming a metal layer among the formed columnar structures, and
removing the organic polymer.

11. A process for production of the organic electroluminescence display according to claim 1, comprising:
for producing said second electrode in said pixel,
performing an etching process in which a phase-separated block copolymer layer in the form of a dot pattern of microdomains is used as a mask, to form a structure having the dot pattern on a first substrate,
using the dot-patterned structure formed on the substrate as a mold, to produce a stamper having said structure on a second substrate; and putting said stamper onto a third substrate on which the desired electrode is to be formed, so as to transfer the pattern onto the third substrate, and then
using a structure formed by transferring the pattern of said stamper as a mask, to produce a metal electrode layer having openings.

12. A process for production of the organic electroluminescence display according to claim 1, comprising:
for producing said second electrode in said pixel,
performing an etching process in which a monoparticle layer of fine particles arranged in the form of a dot pattern of microdomains is used as a mask, to form a structure having the dot pattern on a first substrate,
using the dot-patterned structure formed on the substrate as a mold, to produce a stamper having said structure on a second substrate; and putting said stamper onto a third substrate on which the desired electrode is to be formed, so as to transfer the pattern onto the third substrate, and then
using a structure formed by transferring the pattern of said stamper as a mask, to produce a metal electrode layer having openings.

13. An organic electroluminescence lighting device comprising:
a transparent substrate,
a first electrode placed near to said transparent substrate,
a second electrode placed far from said transparent substrate, said second electrode including a metal electrode layer having a thickness of 10 nm to 200 nm, and
a light-emitting part placed between said first and second electrodes;
wherein
said metal electrode layer comprises
a metal part is seamless and formed of metal continuously connected without breaks between any points therein, and plural openings which penetrate through said layer, which have an average opening diameter of 10 nm to 780 nm and which are arranged so periodically that the distribution of the arrangement is represented by a radial distribution function curve having a half-width of 5 nm to 300 nm.

14. A process for production of the organic electroluminescence lighting device according to claim 13, comprising:
for producing the electrodes,
forming a phase-separated block copolymer layer in the form of a dot pattern of microdomains,
producing a metal electrode layer having openings on the transparent substrate by an etching process in which said dot pattern of microdomains is used as a mask,
forming an organic electroluminescence layer on said metal electrode layer by vapor deposition or by coating, and
forming another electrode on said organic electroluminescence layer by vapor deposition.

15. An organic electroluminescence display comprising:
a substrate,
a pixel-driving circuit unit, and
pixels arranged in the form of a matrix on said substrate;
wherein
said pixel comprises a light-emitting part including
a first electrode placed near to said substrate,
a second electrode placed far from said substrate, said second electrode including a metal electrode layer having a thickness of 10 nm to 200 nm, and
at least one organic layer placed between said first and second electrodes;
and
said metal electrode layer comprises
a metal part is seamless and formed of metal continuously connected without breaks between any points therein, and
plural openings which penetrate through said layer, which have an average opening diameter of 10 nm to ⅓ of the wavelength of used light in the visible wavelength region of 380 nm to 780 nm and which are arranged at such intervals that pitches among the centers of said openings are not less than the average diameter but not more than ½ of said wavelength of light,
under the condition that said metal part in 90% or more of the whole area of said metal electrode layer continues linearly without breaks by said openings in a straight distance of not more than ⅓ of said wavelength of light.

16. A process for production of the organic electroluminescence display according to claim 15, comprising:
for producing said second electrode in said pixel,
forming a phase-separated block copolymer layer in the form of a dot pattern of microdomains, and
producing a metal electrode layer having openings by an etching process in which said dot pattern of microdomains is used as a mask.

17. An organic electroluminescence lighting device comprising:
a transparent substrate,
a first electrode placed near to said transparent substrate,
a second electrode placed far from said transparent substrate, said second electrode including metal electrode layer having a thickness of 10 nm to 200 nm, and
a light-emitting part placed between said first and second electrodes;
wherein
said metal electrode layer comprises
a metal part is seamless and formed of metal continuously connected without breaks between any points therein, and
plural openings which penetrate through said layer, which have an average opening diameter of 10 nm to ⅓ of the wavelength of used light in the visible wavelength region of 380 nm to 780 nm and which are arranged at such intervals that pitches among the centers of said openings are not less than the average diameter but not more than ½ of said wavelength of light,
under the condition that said metal part in 90% or more of the whole area of said metal electrode layer continues linearly without breaks by said openings in a straight distance of not more than ⅓ of said wavelength of light.

18. A process for production of the organic electroluminescence lighting device according to claim 17, comprising:
for producing the electrodes,
forming a phase-separated block copolymer layer in the form of a dot pattern of microdomains,
producing a metal electrode layer having openings on the transparent substrate by an etching process in which said dot pattern of microdomains is used as a mask,
forming an organic electroluminescence layer on said metal electrode layer by vapor deposition or by coating, and
forming another electrode on said organic electroluminescence layer by vapor deposition.

* * * * *